(12) United States Patent
Drogi et al.

(10) Patent No.: US 11,374,538 B2
(45) Date of Patent: Jun. 28, 2022

(54) APPARATUS AND METHODS FOR ENVELOPE TRACKING

(71) Applicant: Skyworks Solutions, Inc., Irvine, CA (US)

(72) Inventors: Serge Francois Drogi, Flagstaff, AZ (US); Florinel G. Balteanu, Irvine, CA (US); David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 65 days.

(21) Appl. No.: 16/837,319

(22) Filed: Apr. 1, 2020

(65) Prior Publication Data

US 2020/0336110 A1 Oct. 22, 2020

Related U.S. Application Data

(60) Provisional application No. 62/831,304, filed on Apr. 9, 2019.

(51) Int. Cl.
*H03F 1/02* (2006.01)
*H03F 3/21* (2006.01)
(Continued)

(52) U.S. Cl.
CPC ............. *H03F 1/0227* (2013.01); *H03F 3/19* (2013.01); *H03F 3/21* (2013.01); *H04B 1/3838* (2013.01); *H04B 1/40* (2013.01); *H03F 2200/102* (2013.01)

(58) Field of Classification Search
CPC .................................................. H03F 1/0227
See application file for complete search history.

(56) References Cited

U.S. PATENT DOCUMENTS 6,438,365 B1   8/2002 Balteanu
6,704,560 B1   3/2004 Balteanu et al.
(Continued)

OTHER PUBLICATIONS

Diaz et al., "Three-Level Cell Topology for a Multilevel Power Supply to Achieve high Efficienty Envelope Amplifier," IEEE Transactions on Circuits and Systems-I: Regular Papers, vol. 59, No. 9, Sep. 2012, in 14 pages.
(Continued)

*Primary Examiner* — Patricia T Nguyen
(74) *Attorney, Agent, or Firm* — Knobbe, Martens, Olson & Bear, LLP

(57) ABSTRACT

Envelope tracking systems for power amplifiers are provided herein. In certain embodiments, an envelope tracker supplies power to a power amplifier that amplifies an RF signal. The envelope tracker includes a multi-level switching circuit that generates an output current based on an envelope signal indicating an envelope of the RF signal. The envelope tracker further includes a combiner that combines a DC voltage with the output current of the multi-level switching circuit to generate a power amplifier supply voltage for the power amplifier. Accordingly, the output current of the multi-level switching circuit and a DC voltage are combined to generate the power amplifier supply voltage. Implementing the envelope tracking system in this manner can provide enhanced efficiency and/or higher bandwidth relative to an envelope tracking system in which a multi-level switching circuit directly outputs a power amplifier supply voltage.

20 Claims, 17 Drawing Sheets

(51) Int. Cl.
*H04B 1/3827* (2015.01)
*H04B 1/40* (2015.01)
*H03F 3/19* (2006.01)

(56) References Cited

U.S. PATENT DOCUMENTS

| | | | |
|---|---|---|---|
| 6,977,976 B1 | 12/2005 | Birkett et al. | |
| 7,058,373 B2* | 6/2006 | Grigore | H03F 1/0227 455/127.1 |
| 7,496,339 B2 | 2/2009 | Balteanu et al. | |
| 8,140,028 B2 | 3/2012 | Balteanu et al. | |
| 8,351,873 B2 | 1/2013 | Balteanu et al. | |
| 8,718,188 B2 | 5/2014 | Balteanu et al. | |
| 8,786,371 B2 | 7/2014 | Popplewell et al. | |
| 8,981,847 B2 | 3/2015 | Balteanu | |
| 9,083,455 B2 | 7/2015 | Popplewell et al. | |
| 9,092,393 B2 | 7/2015 | Whitefield et al. | |
| 9,118,277 B2 | 8/2015 | Balteanu et al. | |
| 9,143,096 B2 | 9/2015 | Balteanu et al. | |
| 9,189,430 B2 | 11/2015 | Ross et al. | |
| 9,197,128 B2 | 11/2015 | Popplewell et al. | |
| 9,294,054 B2 | 3/2016 | Balteanu et al. | |
| 9,356,512 B2 | 5/2016 | Chowdhury et al. | |
| 9,391,648 B2 | 7/2016 | Popplewell et al. | |
| 9,425,833 B2 | 8/2016 | Popplewell et al. | |
| 9,445,371 B2 | 9/2016 | Khesbak et al. | |
| 9,584,070 B2 | 2/2017 | Balteanu et al. | |
| 9,588,529 B2 | 3/2017 | Balteanu et al. | |
| 9,606,947 B2 | 3/2017 | Ross et al. | |
| 9,668,215 B2 | 5/2017 | Balteanu et al. | |
| 9,673,707 B2 | 6/2017 | Popplewell et al. | |
| 9,698,832 B2 | 7/2017 | Popplewell et al. | |
| 9,774,300 B2 | 9/2017 | Jin et al. | |
| 9,806,676 B2 | 10/2017 | Balteanu et al. | |
| 9,831,765 B2 | 11/2017 | Liu et al. | |
| 9,831,834 B2 | 11/2017 | Balteanu et al. | |
| 9,876,473 B2 | 1/2018 | Khesbak et al. | |
| 9,893,682 B2 | 2/2018 | Zhu et al. | |
| 9,935,582 B2 | 4/2018 | Balteanu et al. | |
| 9,948,241 B2 | 4/2018 | Popplewell et al. | |
| 9,971,377 B2 | 5/2018 | Balteanu et al. | |
| 9,973,088 B2 | 5/2018 | Balteanu et al. | |
| 9,990,322 B2 | 6/2018 | Whitefield et al. | |
| 9,991,856 B2 | 6/2018 | Khesbak et al. | |
| 2013/0043944 A1 | 2/2013 | Jones | |
| 2014/0218109 A1 | 8/2014 | Wimpenny | |
| 2014/0312970 A1 | 10/2014 | Nagasaku et al. | |
| 2014/0327483 A1 | 11/2014 | Balteanu | |
| 2014/0361837 A1 | 12/2014 | Strange et al. | |
| 2015/0137886 A1 | 5/2015 | Tanio | |
| 2015/0155836 A1 | 6/2015 | Midya et al. | |
| 2015/0214898 A1* | 7/2015 | Fagg | H03F 1/0222 330/252 |
| 2016/0056714 A1* | 2/2016 | Ek | H02M 3/158 323/271 |
| 2016/0094186 A1* | 3/2016 | Cohen | H03F 1/0233 330/297 |
| 2016/0254746 A1 | 9/2016 | Lerdworatawee | |
| 2017/0131734 A1 | 5/2017 | Balteanu et al. | |
| 2017/0195972 A1 | 7/2017 | Drogi et al. | |
| 2017/0223632 A1 | 8/2017 | Balteanu et al. | |
| 2017/0228332 A1 | 8/2017 | Ross et al. | |
| 2017/0338773 A1 | 11/2017 | Balteanu et al. | |
| 2018/0076772 A1* | 3/2018 | Khesbak | H03F 1/3247 |
| 2018/0138862 A1 | 5/2018 | Balteanu et al. | |
| 2018/0152144 A1* | 5/2018 | Choo | H03F 3/245 |
| 2018/0152945 A1 | 5/2018 | Balteanu | |
| 2018/0159476 A1 | 6/2018 | Balteanu et al. | |
| 2018/0159478 A1 | 6/2018 | Balteanu et al. | |
| 2018/0167037 A1 | 6/2018 | Zhu et al. | |
| 2018/0234095 A1 | 8/2018 | Balteanu et al. | |
| 2018/0278214 A1 | 9/2018 | Jin et al. | |
| 2018/0287573 A1 | 10/2018 | Khesbak et al. | |
| 2018/0294776 A1 | 10/2018 | Popplewell et al. | |
| 2018/0302036 A1 | 10/2018 | Balteanu et al. | |
| 2018/0331659 A1 | 11/2018 | Khesbak et al. | |
| 2018/0351454 A1 | 12/2018 | Khesbak et al. | |
| 2018/0375476 A1 | 12/2018 | Balteanu et al. | |
| 2018/0375483 A1 | 12/2018 | Balteanu et al. | |
| 2019/0020315 A1 | 1/2019 | Khesbak et al. | |
| 2019/0123690 A1 | 4/2019 | Balteanu et al. | |
| 2019/0158046 A1 | 5/2019 | Lehtola et al. | |
| 2019/0165736 A1 | 5/2019 | Khesbak et al. | |
| 2019/0190462 A1 | 6/2019 | Zhu et al. | |
| 2019/0229621 A1 | 7/2019 | Balteanu et al. | |
| 2019/0341888 A1 | 11/2019 | Drogi et al. | |
| 2019/0372526 A1 | 12/2019 | Balteanu et al. | |
| 2019/0372628 A1 | 12/2019 | Balteanu et al. | |
| 2019/0386617 A1 | 12/2019 | Naraine et al. | |
| 2020/0067406 A1 | 2/2020 | Khesbak et al. | |
| 2020/0099343 A1 | 3/2020 | Khesbak et al. | |
| 2020/0112300 A1 | 4/2020 | Balteanu et al. | |
| 2020/0127619 A1 | 4/2020 | Khesbak et al. | |
| 2020/0154434 A1 | 5/2020 | Balteanu | |
| 2020/0162028 A1 | 5/2020 | Balteanu et al. | |
| 2020/0162030 A1 | 5/2020 | Drogi et al. | |
| 2020/0259458 A1 | 8/2020 | Balteanu et al. | |
| 2020/0259459 A1 | 8/2020 | Balteanu et al. | |
| 2020/0295713 A1 | 9/2020 | Khlat | |
| 2020/0336110 A1 | 10/2020 | Drogi et al. | |
| 2020/0336122 A1 | 10/2020 | Lin et al. | |
| 2020/0343865 A1 | 10/2020 | Balteanu et al. | |
| 2020/0350878 A1 | 11/2020 | Drogi et al. | |
| 2021/0083576 A1 | 3/2021 | Bansal et al. | |
| 2021/0119592 A1 | 4/2021 | Drogi et al. | |

OTHER PUBLICATIONS

Florian et al., "Envelope tracking of an RF High Power Amplifier with an 8-Level Digitally Controlled GaN-on-Si Supply Modulator," IEEE Transactions on Microwave Theory and Techniques, vol. 63, No. 8, Aug. 2015, in 14 pages.

Garcia et al., "Comparison of Two Multilevel Architectures for Envelope Amplifier," Universidad Politecnica de Madrid, Centro de Electrónica Industrial, 2009, in 7 pages.

Huang et al., "A MASH-Controlled Multilevel Power Converter for high-Effiiciency RF Transmitters," IEEE Transactions on Power Electronics, vol. 26, No. 4, Apr. 2011, in 10 pages.

Kashani et al., "Digital Multi-Level Closed Loop Design for Wideband Envelope Tracking Systems," 2016 ICSEE International Conference on the Science of Electrical Engineering, 2016, in 5 pages.

Kim et al., "Envelope Amplifier with Multiple-Linear Regulator for Envelope Trackng Power Amplifier," IEEE Transactions on Microwave Theory and Techniques, vol. 61, No. 11, Nov. 2013, in 10 pages.

Xi et al., "Feed-Forward Scheme Considering Bandwidth Limitation of Operational Amplifiers for Envelope Tracking Power Supply Using Series-Connected Composite Configuration," IEEE Transactions on Industrial Electronics, vol. 60, No. 9, Sep. 2013, in 12 pages.

* cited by examiner

APPARATUS AND METHODS FOR ENVELOPE TRACKING

CROSS-REFERENCE TO RELATED APPLICATIONS

This application claims the benefit of priority under 35 U.S.C. § 119 of U.S. Provisional Patent Application No. 62/831,304, filed Apr. 9, 2019 and titled "APPARATUS AND METHODS FOR ENVELOPE TRACKING," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for Fifth Generation (5G) communications in Frequency Range 1 (FR1).

SUMMARY

In certain embodiments, the present disclosure relates to an envelope tracking system. The envelope tracking system includes a power amplifier configured to amplify a radio frequency transmit signal, and an envelope tracker configured to generate a power amplifier supply voltage of the power amplifier. The envelope tracker includes a multi-level switching circuit configured to generate an output current based on an envelope signal indicating an envelope of the radio frequency transmit signal, and a combiner configured to combine a DC voltage with the output current to thereby generate the power amplifier supply voltage.

In various embodiments, the multi-level switching circuit includes a multi-level supply DC-to-DC converter configured to generate a plurality of regulated voltages of different voltage levels, a modulator configured to receive the plurality of regulated voltages and to generate the output current, and a control circuit configured to control the modulator based on the envelope signal. According to a number of embodiments, the multi-level supply DC-to-DC converter is further configured to generate the DC voltage. In accordance with several embodiments, the multi-level switching circuit has an output providing the output current, and the modulator further includes a plurality of switches each electrically connected between a corresponding one of the plurality of regulated voltages and the output. According to some embodiments, the control circuit includes a sigma-delta encoder. In accordance with a number of embodiments, the multi-level switching circuit further includes an amplifier interposed between the modulator and the combiner.

In several embodiments, the multi-level switching circuit includes a switched capacitor multi-level supply circuit configured to generate a plurality of regulated voltages of different voltage levels, a modulator configured to receive the plurality of regulated voltages and to generate the output current, and a control circuit configured to control the modulator based on the envelope signal.

In various embodiments, the envelope tracker further includes a DC-to-DC converter configured to generate the DC voltage.

In a number of embodiments, the multi-level switching circuit has an output providing the output current, and the combiner includes a first inductor electrically connected between the DC voltage and the power amplifier supply voltage, and a series capacitor connected between the output and the power amplifier supply voltage. According to several embodiments, the combiner further includes a second inductor electrically connected in series with the series capacitor between the output and the power amplifier supply voltage. In accordance with some embodiments, the combiner further includes a shunt capacitor electrically connected between the DC voltage and ground. According to various embodiments, the combiner further includes a controllable bandwidth adjustment capacitor electrically connected between the power amplifier supply voltage and ground.

In several embodiments, the envelope tracking system is implemented on a packaged module.

In some embodiments, the power amplifier and the combiner are commonly packaged.

In certain embodiments, the present disclosure relates to a mobile device. The mobile device includes a transceiver configured to generate a radio frequency transmit signal, a front end circuit including a power amplifier configured to amplify the radio frequency transmit signal, and a power management circuit including an envelope tracker configured to generate a power amplifier supply voltage of the power amplifier, the envelope tracker including a multi-level switching circuit configured to generate an output current based on an envelope signal indicating an envelope of the radio frequency transmit signal, and a combiner configured to combine a DC voltage with the output current to generate a power amplifier supply voltage of the power amplifier.

In various embodiments, the multi-level switching circuit includes a multi-level supply DC-to-DC converter configured to generate a plurality of regulated voltages of different voltage levels, a modulator configured to receive the plurality of regulated voltages and to generate the output current, and a control circuit configured to control the modulator based on the envelope signal. According to a number of embodiments, the multi-level supply DC-to-DC converter is further configured to generate the DC voltage. In accordance with some embodiments, the multi-level switching circuit has an output providing the output current, and the modulator further includes a plurality of switches each electrically connected between a corresponding one of the plurality of regulated voltages and the output. According to several embodiments, the control circuit includes a sigma-delta encoder. In accordance with a number of embodiments, the multi-level switching circuit further includes an amplifier interposed between the modulator and the combiner.

In several embodiments, the multi-level switching circuit includes a switched capacitor multi-level supply circuit configured to generate a plurality of regulated voltages of different voltage levels, a modulator configured to receive the plurality of regulated voltages and to generate the output current, and a control circuit configured to control the modulator based on the envelope signal.

In various embodiments, the envelope tracker further includes a DC-to-DC converter configured to generate the DC voltage.

In a number of embodiments, the multi-level switching circuit has an output providing the output current, and the combiner includes a first inductor electrically connected between the DC voltage and the power amplifier supply voltage, and a series capacitor connected between the output and the power amplifier supply voltage. According to several embodiments, the combiner further includes a second inductor electrically connected in series with the series capacitor between the output and the power amplifier supply voltage. In accordance with some embodiments, the combiner further includes a shunt capacitor electrically connected between the DC voltage and ground. According to various embodiments, the combiner further includes a controllable bandwidth adjustment capacitor electrically connected between the power amplifier supply voltage and ground.

In some embodiments, the mobile device further includes a battery operable to provide a battery voltage to the multi-level switching circuit.

In several embodiments, the mobile device further includes an antenna configured to radiate a transmit wave in response to receiving an amplified radio frequency transmit signal from the power amplifier.

In certain embodiments, the present disclosure relates to a method of envelope tracking. The method includes amplifying a radio frequency transmit signal using a power amplifier, generating an output current based on an envelope signal using a multi-level switching circuit, the envelope signal indicating an envelope of the radio frequency transmit signal, and generating a power amplifier supply voltage of the power amplifier by combining a DC voltage and the output current using a combiner.

In various embodiments, generating the output current includes generating a plurality of regulated voltages of different voltage levels using a multi-level supply DC-to-DC converter, and modulating the plurality of regulated voltages based on the envelope signal to generate the output current using a modulator. According to several embodiments, the method further includes generating the DC voltage using the multi-level supply DC-to-DC converter. In accordance with a number of embodiments, the method further includes controlling the modulator based on the envelope signal using a sigma-delta encoder.

In a number of embodiments, the method further includes generating the DC voltage using a DC-to-DC converter.

In several embodiments, the method further includes adjusting a modulation bandwidth of envelope tracking using a controllable bandwidth adjustment capacitor of the combiner.

In certain embodiments, the present disclosure relates to an envelope tracking system. The envelope tracking system includes a first power amplifier configured to amplify a first radio frequency signal, a second power amplifier configured to amplify a second radio frequency signal, and an envelope tracker configured to generate a first supply voltage of the first power amplifier and a second supply voltage of the second power amplifier. The envelope tracker includes a multi-level switching circuit configured to generate a first output current based on an envelope of the first radio frequency signal and a second output current based on an envelope of the second radio frequency signal, a first combiner configured to combine a first DC voltage with the first output current to generate the first supply voltage, and a second combiner configured to combine a second DC voltage with the second output current to generate the second supply voltage.

In a number of embodiments, the multi-level switching circuit includes a multi-level supply DC-to-DC converter configured to generate a plurality of regulated voltages of different voltage levels, a first modulator configured to receive the plurality of regulated voltages and to generate the first output current, and a second modulator configured to receive the plurality of regulated voltages and to generate the second output current. According to several embodiments, the multi-level supply DC-to-DC converter is further configured to generate at least one of the first DC voltage or the second DC voltage. In accordance with some embodiments, the multi-level switching circuit further includes a sigma-delta encoder configured to control the first modulator.

In various embodiments, the multi-level switching circuit includes a switched capacitor multi-level-supply circuit configured to generate a plurality of regulated voltages of different voltage levels, a first modulator configured to receive the plurality of regulated voltages and to generate the first output current, and a second modulator configured to receive the plurality of regulated voltages and to generate the second output current.

In some embodiments, the envelope tracker further includes a first DC-to-DC converter configured to generate the first DC voltage and a second DC-to-DC converter configured to generate the second DC voltage.

In various embodiments, the envelope tracker further includes a multi-output DC-to-DC converter configured to generate the first DC voltage and the second DC voltage. According to a number of embodiments, the multi-output DC-to-DC converter generates two or more output voltages, and the envelope tracker further includes a selecting circuit configured to select which of the two or more output voltages serves as the first DC voltage and which of the two or more output voltages serves as the second DC voltage.

In several embodiments, the multi-level switching circuit has a first output providing the first output current, the first combiner including a first inductor electrically connected between the first DC voltage and the first supply voltage, and a series capacitor connected between the first output and the first supply voltage. According to a number of embodiments, the first combiner further includes a second inductor electrically connected in series with the series capacitor between the first output and the first supply voltage. In accordance with some embodiments, the first combiner further includes a controllable bandwidth adjustment capacitor electrically connected between the first supply voltage and ground.

In a number of embodiments, the first radio frequency signal corresponds to a first carrier signal for carrier aggregation, and the second radio frequency signal corresponds to a second carrier signal for carrier aggregation.

In some embodiments, the envelope tracking system is implemented on a packaged module.

In various embodiments, the first power amplifier, the second power amplifier, the first combiner, and the second combiner are commonly packaged.

In several embodiments, the envelope tracking system further includes a third power amplifier powered by a third supply voltage from the envelope tracker, and the envelope tracker further includes a third combiner configured to combine a third DC voltage with a third output current from the multi-level switching circuit to generate the third supply voltage.

In certain embodiments, the present disclosure relates to a mobile device. The mobile device includes a transceiver configured to generate a first radio frequency signal and a second radio frequency signal, a front end circuit including a first power amplifier configured to amplify the first radio frequency signal and a second power amplifier configured to amplify the second radio frequency signal, and a power management circuit including an envelope tracker configured to generate a first supply voltage of the first power amplifier and a second supply voltage of the second power amplifier. The envelope tracker includes a multi-level switching circuit configured to generate a first output current based on an envelope of the first radio frequency signal and a second output current based on an envelope of the second radio frequency signal, a first combiner configured to combine a first DC voltage with the first output current to generate the first supply voltage, and a second combiner configured to combine a second DC voltage with the second output current to generate the second supply voltage.

In several embodiments, the multi-level switching circuit includes a multi-level supply DC-to-DC converter configured to generate a plurality of regulated voltages of different voltage levels, a first modulator configured to receive the plurality of regulated voltages and to generate the first output current, and a second modulator configured to receive the plurality of regulated voltages and to generate the second output current. According to a number of embodiments, the multi-level supply DC-to-DC converter is further configured to generate at least one of the first DC voltage or the second DC voltage. In accordance with various embodiments, the multi-level switching circuit further includes a sigma-delta encoder configured to control the first modulator.

In some embodiments, the multi-level switching circuit includes a switched capacitor multi-level supply circuit configured to generate a plurality of regulated voltages of different voltage levels, a first modulator configured to receive the plurality of regulated voltages and to generate the first output current, and a second modulator configured to receive the plurality of regulated voltages and to generate the second output current.

In various embodiments, the envelope tracker further includes a first DC-to-DC converter configured to generate the first DC voltage and a second DC-to-DC converter configured to generate the second DC voltage.

In a number of embodiments, the envelope tracker further includes a multi-output DC-to-DC converter configured to generate the first DC voltage and the second DC voltage. According to several embodiments, the multi-output DC-to-DC converter generates two or more output voltages, and the envelope tracker further includes a selecting circuit configured to select which of the two or more output voltages serves as the first DC voltage and which of the two or more output voltages serves as the second DC voltage.

In several embodiments, the multi-level switching circuit has a first output providing the first output current, and the first combiner includes a first inductor electrically connected between the first DC voltage and the first supply voltage, and a series capacitor connected between the first output and the first supply voltage. According to various embodiments, the first combiner further includes a second inductor electrically connected in series with the series capacitor between the first output and the first supply voltage. In accordance with a number of embodiments, the first combiner further includes a controllable bandwidth adjustment capacitor electrically connected between the first supply voltage and ground.

In some embodiments, the first radio frequency signal corresponds to a first carrier signal for carrier aggregation, and the second radio frequency signal corresponds to a second carrier signal for carrier aggregation.

In various embodiments, the mobile device further includes a battery operable to provide a battery voltage to the multi-level switching circuit.

In several embodiments, the mobile device further includes a first antenna configured to radiate a first transmit wave in response to receiving a first amplified radio frequency signal from the first power amplifier, and a second antenna configured to radiate a second transmit wave in response to receiving a second amplified radio frequency signal from the second power amplifier.

In a number of embodiments, the front end circuit further includes a third power amplifier powered by a third supply voltage from the envelope tracker, and the envelope tracker further includes a third combiner configured to combine a third DC voltage with a third output current from the multi-level switching circuit to generate the third supply voltage.

In certain embodiments, the present disclosure relates to a method of envelope tracking. The method includes amplifying a first radio frequency signal using a first power amplifier, amplifying a second radio frequency signal using a second power amplifier, generating a first output current based on an envelope of the first radio frequency signal using a multi-level switching circuit, and generating a second output current based on an envelope of the second radio frequency signal using the multi-level switching circuit, generating a first supply voltage of the first power amplifier by combining a first DC voltage and the first output current using a first combiner, and generating a second supply voltage of the second power amplifier by combining a second DC voltage and the second output current using a second combiner.

In various embodiments, the method further includes generating a plurality of regulated voltages of different voltage levels using a multi-level supply DC-to-DC converter of the multi-level switching circuit, and modulating the plurality of regulated voltages based on the envelope of the first radio frequency signal to generate the first output current using a first modulator of the multi-level switching circuit. According to several embodiments, the method further includes modulating the plurality of regulated voltages based on the envelope of the second radio frequency signal to generate the second output current using a second modulator of the multi-level switching circuit. In accordance with a number of embodiments, the method further includes generating at least one of the first DC voltage or the second DC voltage using the multi-level supply DC-to-DC converter. According to some embodiments, the method further includes controlling the first modulator based on the envelope signal using a sigma-delta encoder of the multi-level switching circuit.

In several embodiments, the method further includes generating the first DC voltage using a first DC-to-DC converter, and generating the second DC voltage using a second DC-to-DC converter.

In a number of embodiments, the method further includes adjusting a first modulation bandwidth using a first controllable bandwidth adjustment capacitor of the first combiner, and adjusting a second modulation bandwidth using a second controllable bandwidth adjustment capacitor of the second combiner.

In some embodiments the method further includes amplifying a third radio frequency signal using a third power amplifier, generating a third output current based on an envelope of the third radio frequency signal using the multi-level switching circuit, and generating a third supply voltage of the third power amplifier by combining a third DC voltage and the third output current using a third combiner.

DETAILED DESCRIPTION OF EMBODIMENTS

Figure 1:
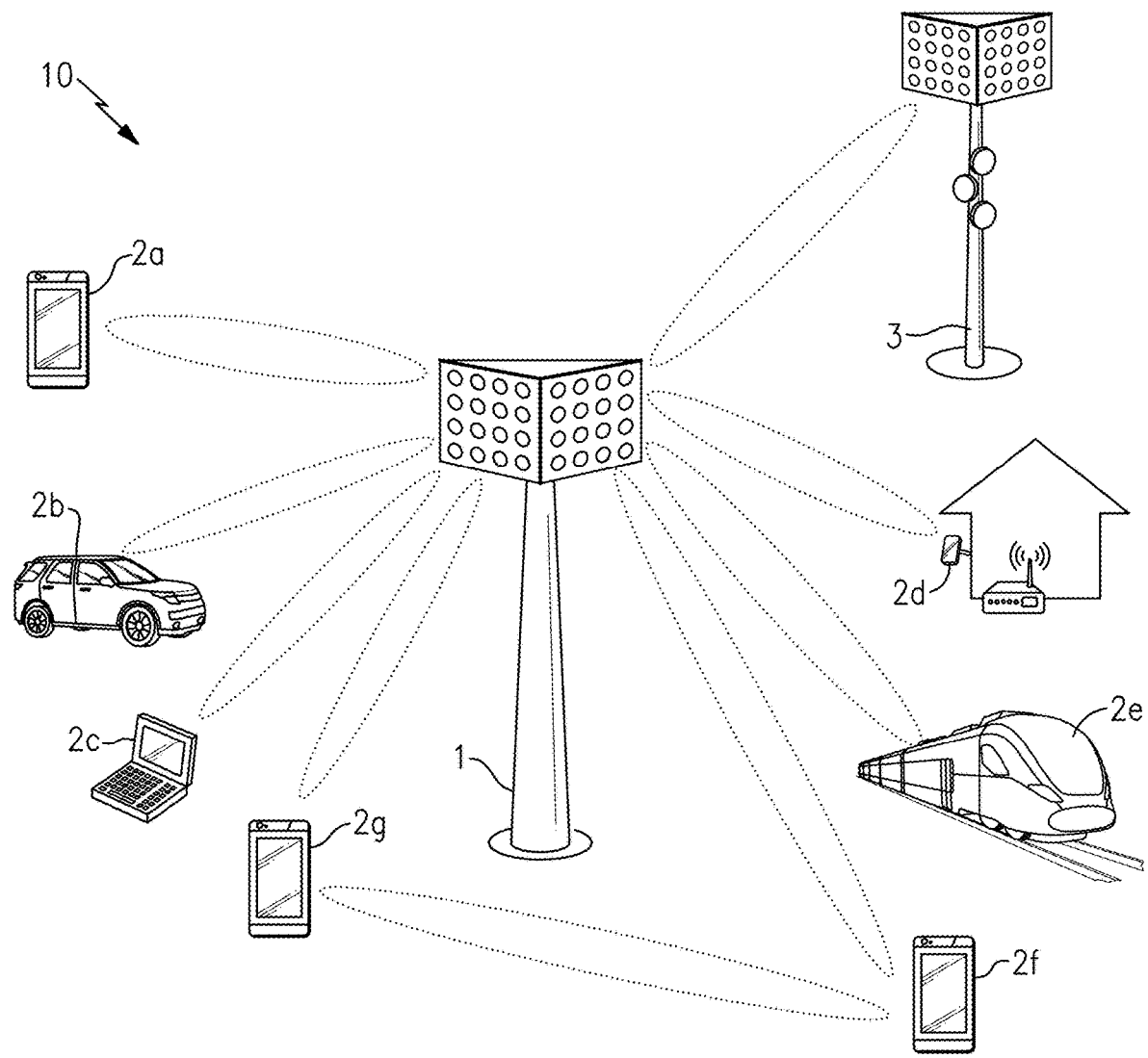
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2020). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
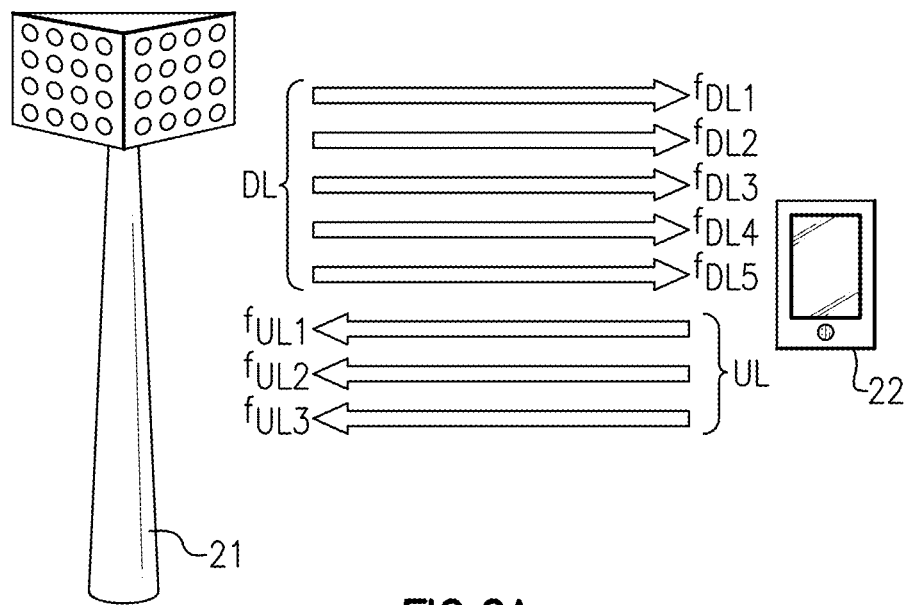
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
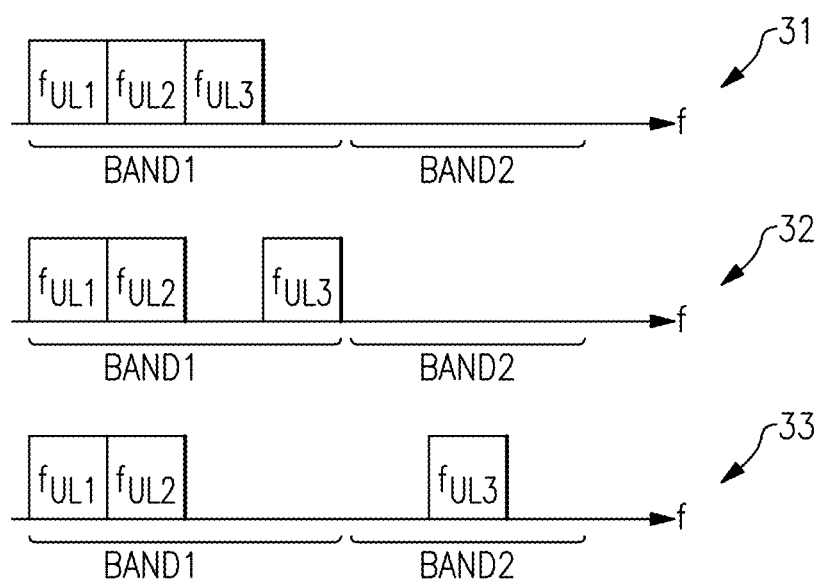
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
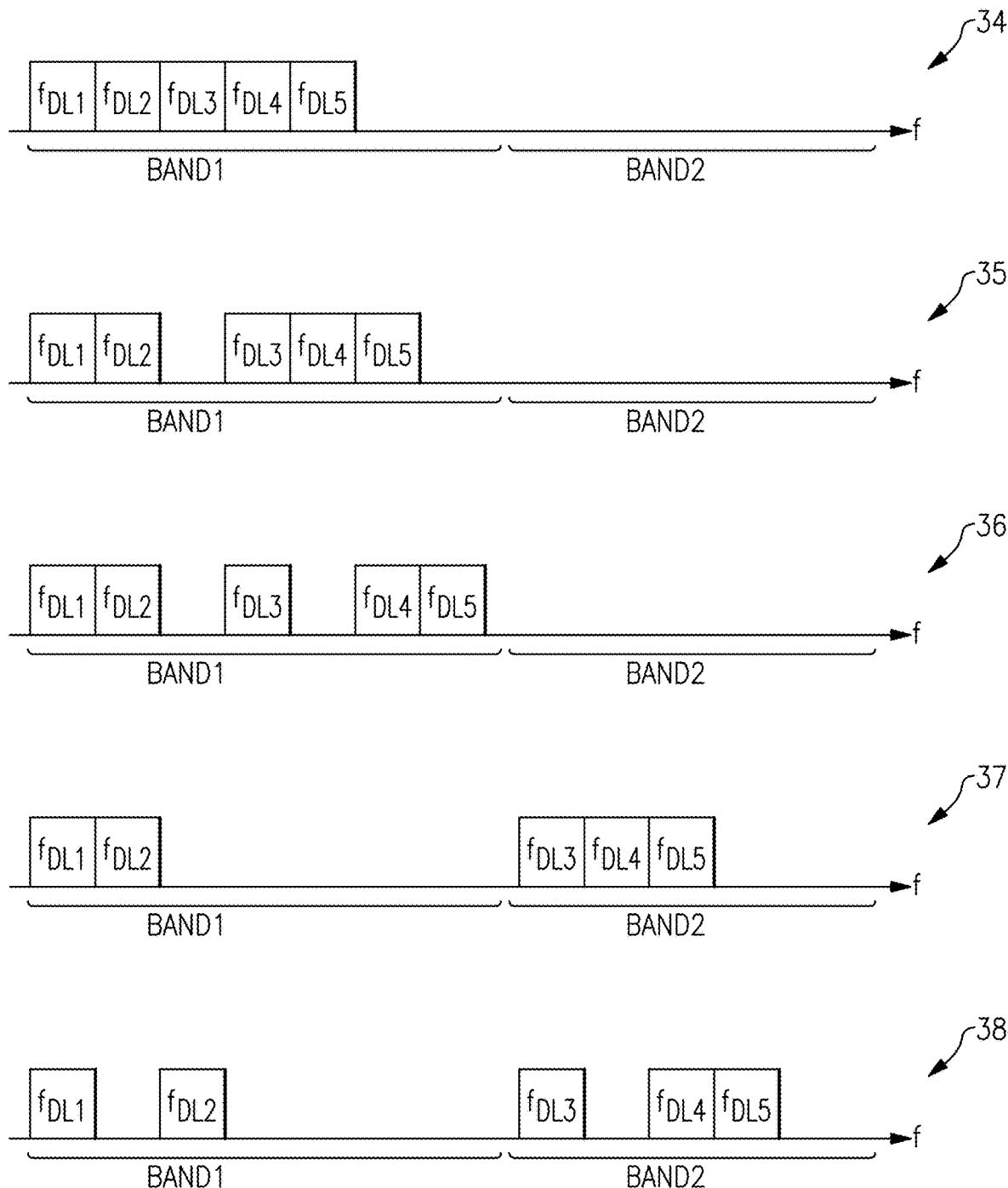
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Examples of Envelope Tracking Systems

Envelope tracking (ET) is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier is increased. Likewise, when the envelope of the RF signal decreases, the voltage supplied to the power amplifier is decreased to reduce power consumption.

Envelope tracking systems for power amplifiers are provided herein. In certain embodiments, an envelope tracker supplies power to a power amplifier that amplifies an RF signal. The envelope tracker includes a multi-level switching circuit that generates an output current based on an envelope signal indicating an envelope of the RF signal. The envelope tracker further includes an ET combiner that combines a DC voltage with the output current of the multi-level switching circuit to generate a power amplifier supply voltage for the power amplifier.

Accordingly, the output current of the multi-level switching circuit and a DC voltage are combined to generate the power amplifier supply voltage. Implementing the envelope tracking system in this manner can provide enhanced efficiency and/or higher bandwidth relative to an envelope tracking system in which a multi-level switching circuit directly outputs a power amplifier supply voltage.

In certain implementations, the ET combiner includes a series inductor between the DC voltage and the power amplifier supply voltage, and a series capacitor between the output of the multi-level switching circuit and the power amplifier supply voltage. Thus, when the output current from the multi-level switching circuit is about 0 mA, the power amplifier supply voltage is controlled to be about equal to the DC voltage in the steady-state. To adjust the power amplifier supply voltage relative to the DC voltage, the multi-level switching circuit sinks or sources the output current to thereby provide voltage adjustment to the power amplifier supply voltage.

The multi-level switching circuit can be implemented in a wide variety of ways. In certain implementations, the multi-level switching circuit includes a multi-level supply (MLS) DC-to-DC converter that generates multiple regulated voltages of different voltage levels based on a battery voltage, an MLS modulator including a bank of switches each connected between the output of the multi-level switching circuit a corresponding one of the regulated voltages, and a control circuit that processes the envelope signal to open or close particular switches of the bank to thereby generate the output current of the multi-level switching circuit.

In certain implementations, the multi-level switching circuit's control circuit includes a sigma-delta ($\Sigma$-$\Delta$) encoder for processing the envelope signal to generate control signals for the bank of switches. Using a $\Sigma$-$\Delta$ encoder in this manner provides a number of advantages, such as reduced switching artifacts and/or lower noise.

The DC voltage can be generated in a wide variety of ways. In certain implementations, the DC voltage is regulated. For instance, the DC voltage can correspond to a regulated voltage from the MLS DC-to-DC converter of the multi-level switching circuit or a regulated voltage from a separate DC-to-DC converter.

In certain implementations, circuitry of the envelope tracker is shared in part to generate power amplifier supply voltages for two or more power amplifiers. For example, the envelope tracker can include a common or shared MLS DC-to-DC converter that generates multiple regulated voltages, a first MLS modulator that receives the regulated voltages and outputs a first output current, a first ET combiner that combines the first output current and a first fixed voltage to generate a first power amplifier supply voltage for a first power amplifier, a second MLS modulator that receives the regulated voltages and outputs a second output current, and a second ET combiner that combines the second output current and a second fixed voltage to generate a second power amplifier supply voltage for a second power amplifier.

Sharing envelope tracker circuitry can be advantageous in a number of applications, including, but not limited to, uplink carrier aggregation scenarios and/or EN-DC use cases in UE for 5G NR.

FIGS. 3A-9 are schematic diagram of various embodiments of envelope tracking systems for power amplifiers. Although various embodiments of envelope tracking systems are depicted, the teachings herein are applicable to envelope trackers implemented in a wide variety of ways. Accordingly, other implementations are possible.

Figure 3A:
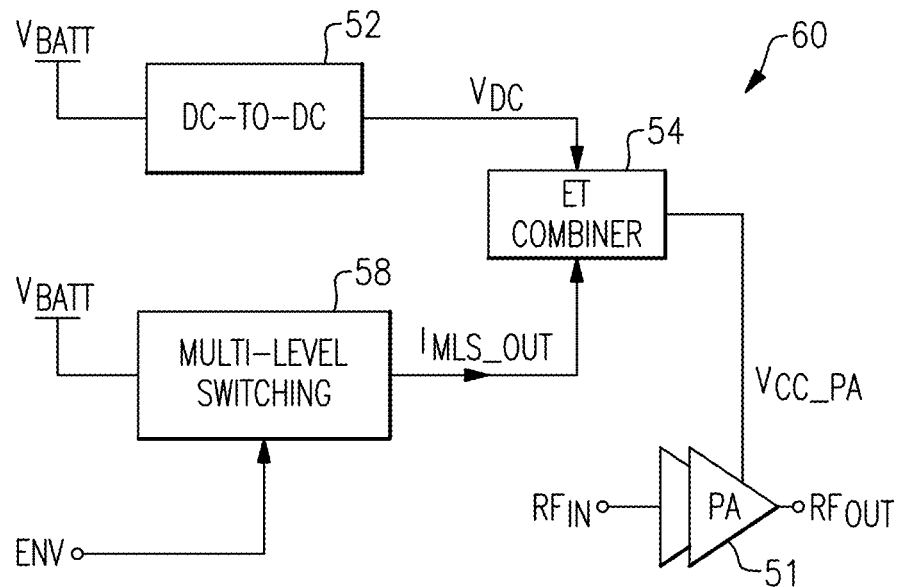
FIG. 3A is a schematic diagram of one embodiment of an envelope tracking system for a power amplifier.

FIG. 3A is a schematic diagram of one embodiment of an envelope tracking system 60 for a power amplifier 51. The envelope tracking system 60 includes a DC-to-DC converter 52, an ET combiner 54, and a multi-level switching circuit 58. The ET combiner 54 is also referred to herein as a combiner.

As shown in FIG. 3A, the power amplifier 51 amplifies an RF input signal $RF_{IN}$ to generate an RF output signal $RF_{OUT}$. Although depicted as including two stages, the power amplifier 51 can include more or fewer stages.

In the illustrated embodiment, the multi-level switching circuit 58 is powered by a battery voltage $V_{BATT}$. Additionally, the multi-level switching circuit 58 receives an envelope signal ENV, which changes in relation to an envelope of the RF input signal $RF_{IN}$. The multi-level switching circuit 58 processes the envelope signal ENV to generate an output current $I_{MLS\_OUT}$.

The multi-level switching circuit 58 can be implemented in a wide variety of ways. In certain implementations, the multi-level switching circuit 58 includes an MLS DC-to-DC converter that generates multiple regulated voltages of different voltage levels, an MLS modulator including a bank of switches each connected between the output of the multi-level switching circuit 58 and a corresponding one of the regulated voltages, and a control circuit that processes the envelope signal ENV to open or close particular switches of the bank to thereby generate the output current $I_{MLS\_OUT}$.

In the illustrated embodiment, the DC-to-DC converter 52 receives the battery voltage $V_{BATT}$ and operates to generate a regulated DC voltage $V_{DC}$. The DC-to-DC converter 52 can be implemented in a wide variety of ways including, but not limited to, using a buck converter, a boost converter, or a buck-boost converter. The DC-to-DC converter 52 is also referred to herein as a switching regulator.

Although the envelope tracking system 60 of FIG. 3A includes the DC-to-DC converter 52, other implementations are possible. For example, in another embodiment, the DC-to-DC converter 52 is omitted in favor of using a regulated voltage provided by an MLS DC-to-DC converter of the multi-level switching circuit 58.

With continuing reference to FIG. 3A, the ET combiner 54 operates to combine the regulated DC voltage $V_{DC}$ from the DC-to-DC converter 52 and the output current $I_{MLS\_OUT}$ of the multi-level switching circuit 58 to generate a power amplifier supply voltage $V_{CC\_PA}$ for the power amplifier 51.

Figure 3B:
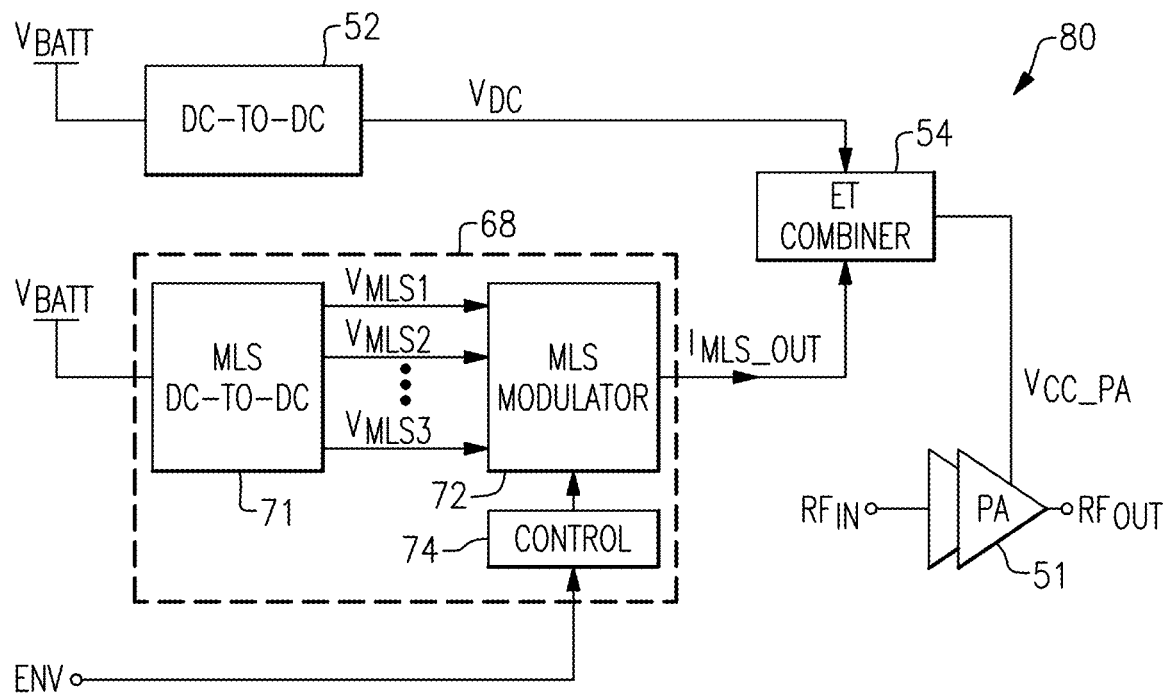
FIG. 3B is a schematic diagram of another embodiment of an envelope tracking system for a power amplifier.

FIG. 3B is a schematic diagram of another embodiment of an envelope tracking system 80 for a power amplifier 51. The envelope tracking system 80 includes a DC-to-DC converter 52, an ET combiner 54, and a multi-level switching circuit 68.

The envelope tracking system 80 of FIG. 3B is similar to the envelope tracking system 60 of FIG. 3A, except that the envelope tracking system 80 illustrates a specific implementation of a multi-level switching circuit. For example, the multi-level switching circuit 68 of FIG. 3B includes an MLS DC-to-DC converter 71, an MLS modulator 72, and a control circuit 74.

As shown in FIG. 3B, the MLS DC-to-DC converter 71 receives a battery voltage $V_{BATT}$ and generates multiple regulated voltages, corresponding to a first regulated voltage $V_{MLS1}$, a second regulated voltage $V_{MLS2}$, and a third regulated voltage $V_{MLS3}$, in this example. Although an example with the MLS DC-to-DC converter 71 generating three regulated voltages is shown, the MLS DC-to-DC converter 71 can generate more or fewer regulated voltages. The MLS DC-to-DC converter 71 can be implemented in a wide variety of ways, including, but not limited to, as a buck-boost converter operable to generate one or more buck voltages below the battery voltage $V_{BATT}$ and/or one or more boost voltages above the battery voltage $V_{BATT}$.

With continuing reference to FIG. 3B, the control circuit 74 processes an envelope signal ENV to generate control signals for the MLS modulator 72. The MLS modulator 72 processes the control signals and the MLS regulated voltages to generate the output current $I_{MLS\_OUT}$ for the ET combiner 54. In certain implementations, the MLS modulator 72 includes a bank of switches that are selectively activated using the control signals from the control circuit 74.

Figure 3C:
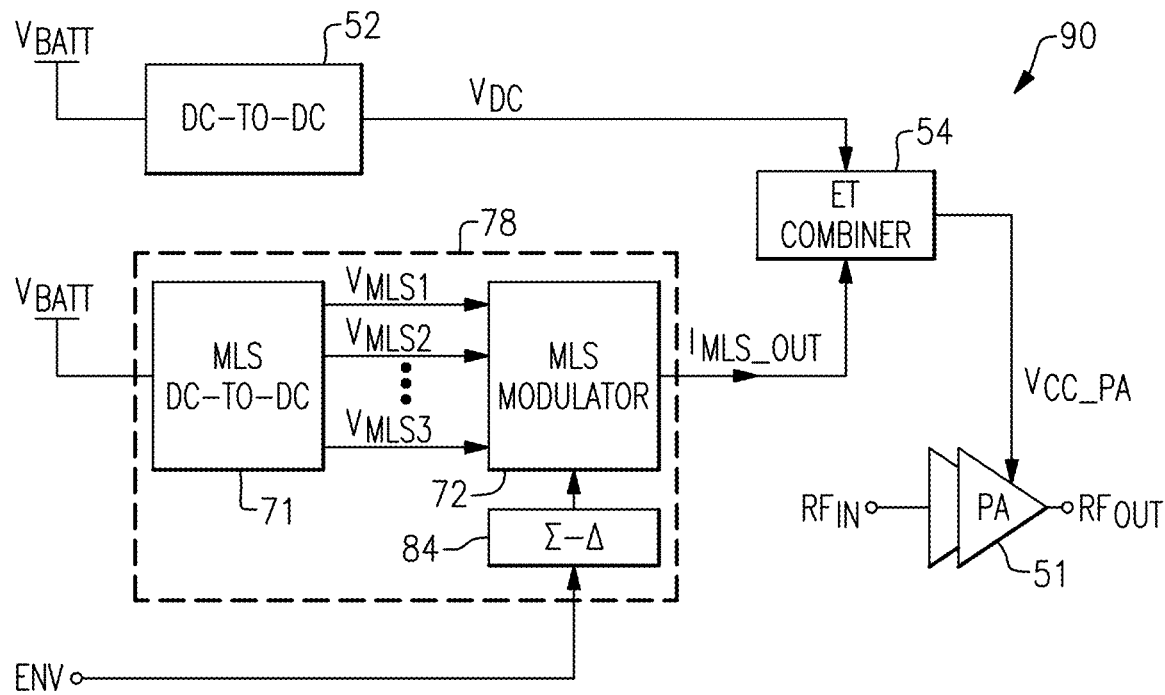
FIG. 3C is a schematic diagram of another embodiment of an envelope tracking system for a power amplifier.

FIG. 3C is a schematic diagram of another embodiment of an envelope tracking system 90 for a power amplifier 51. The envelope tracking system 90 includes a DC-to-DC converter 52, an ET combiner 54, and a multi-level switching circuit 78.

The envelope tracking system 90 of FIG. 3C is similar to the envelope tracking system 80 of FIG. 3B, except that the envelope tracking system 90 illustrates a specific implementation of a control circuit for a multi-level switching circuit. For example, the multi-level switching circuit 78 of FIG. 3C includes an MLS DC-to-DC converter 71, an MLS modulator 72, and a Σ-Δ encoder 84.

In the illustrated embodiment, the Σ-Δ encoder 84 processes the envelope signal ENV to generate control signals for the MLS modulator 72. Using a Σ-Δ encoder in this manner provides a number of advantages, such as reduced switching artifacts and/or lower noise in the output current $I_{MLS\_OUT}$.

Figure 3D:
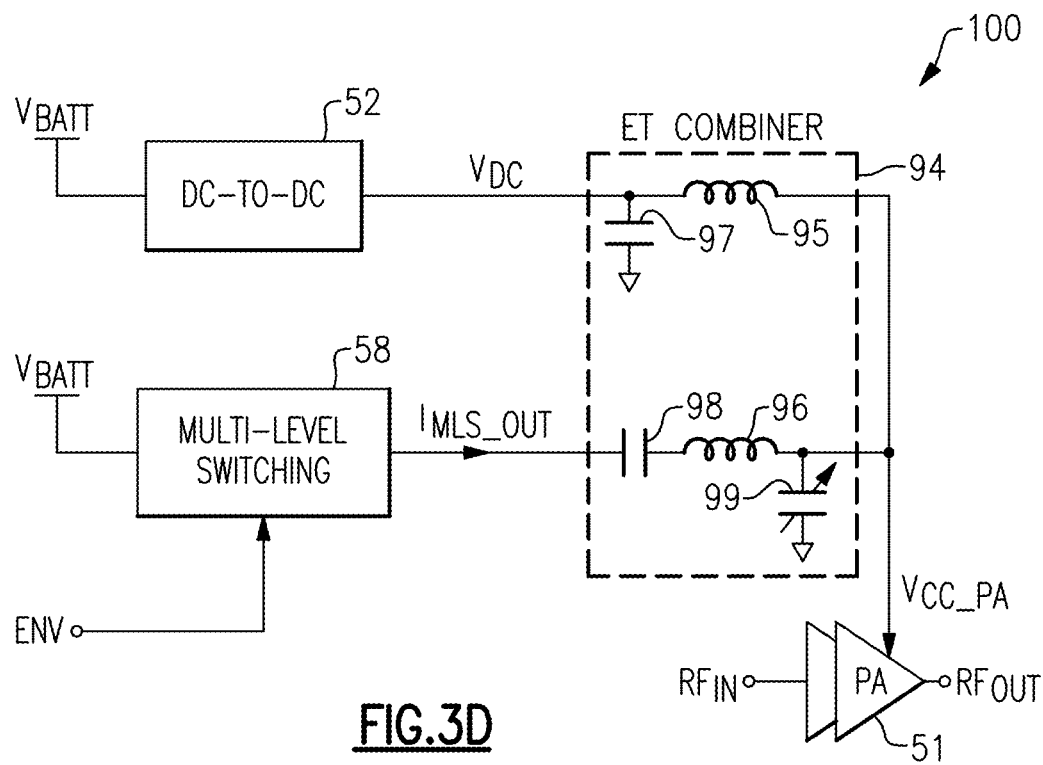
FIG. 3D is a schematic diagram of another embodiment of an envelope tracking system for a power amplifier.

FIG. 3D is a schematic diagram of another embodiment of an envelope tracking system 100 for a power amplifier 51. The envelope tracking system 100 includes a DC-to-DC converter 52, a multi-level switching circuit 58, and an ET combiner 94.

The envelope tracking system 100 of FIG. 3D is similar to the envelope tracking system 60 of FIG. 3A, except that the envelope tracking system 80 illustrates a specific implementation of an ET combiner. For example, the ET combiner 94 of FIG. 3D includes a first inductor 95, a second inductor 96, a shunt capacitor 97, a series capacitor 98, and a controllable bandwidth adjustment capacitor 99.

In the illustrated embodiment, the first inductor 95 is electrically connected between the regulated DC voltage $V_{DC}$ and the power amplifier supply voltage $V_{CC\_PA}$. Additionally, the shunt capacitor 97 is electrically connected between the regulated DC voltage $V_{DC}$ and ground. Furthermore, the series capacitor 98 and the second inductor 96 are electrically connected between the output of the multi-level switching circuit 58 and the power amplifier supply voltage $V_{CC\_PA}$. Furthermore, the controllable bandwidth adjustment capacitor 99 is electrically connected between the power amplifier supply voltage $V_{CC\_PA}$ and ground.

As shown in FIG. 3D, the controllable bandwidth adjustment capacitor 99 has a capacitance value that is controllable. For example, the controllable bandwidth adjustment capacitor 99 can include a bank of digitally-selectable capacitors, an analog-tuned capacitive element, and/or any other controllable capacitor structure. By including the controllable bandwidth adjustment capacitor 99, flexibility is provided for adjusting a modulation bandwidth of the envelope tracking system 100.

Although FIG. 3D depicts the first inductor 95, the second inductor 96, the shunt capacitor 97, and the series capacitor 98 as fixed components, any of these elements can be implemented as controllable components.

Figure 3E:
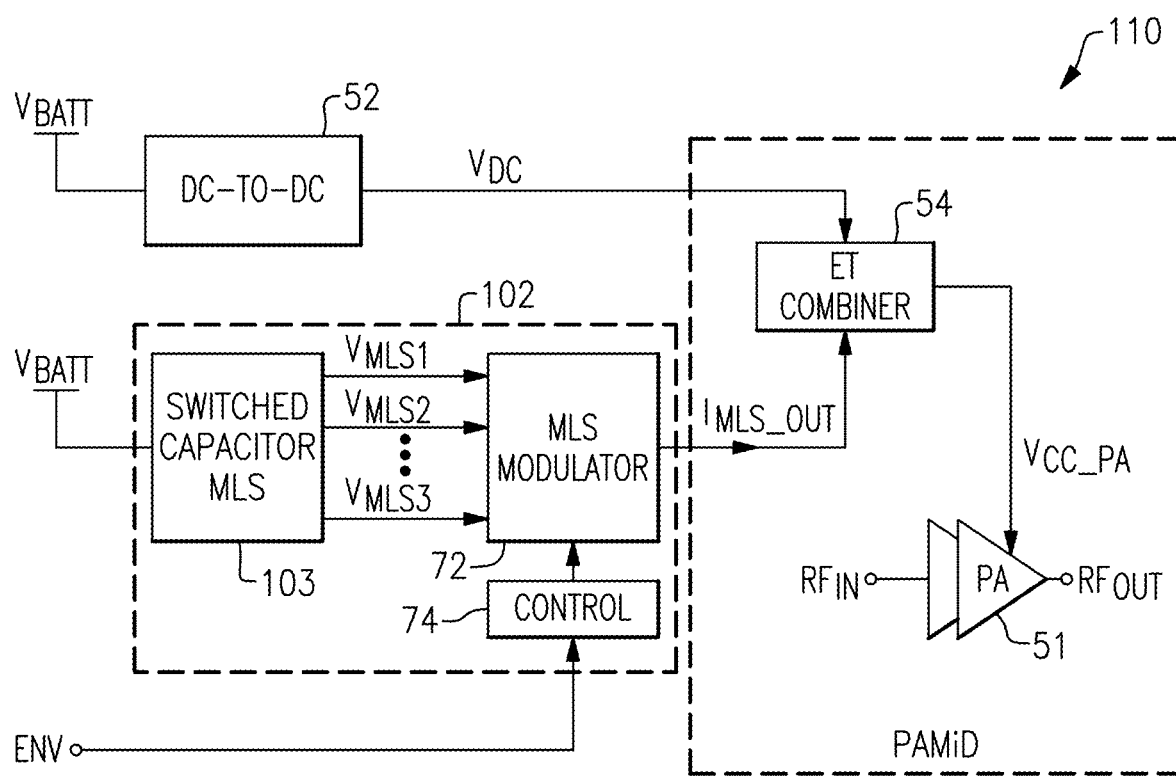
FIG. 3E is a schematic diagram of another embodiment of an envelope tracking system for a power amplifier.

FIG. 3E is a schematic diagram of another embodiment of an envelope tracking system 110 for a power amplifier 51. The envelope tracking system 110 includes a DC-to-DC converter 52, an ET combiner 54, and a multi-level switching circuit 102. The multi-level switching circuit 102 includes a control circuit 72, an MLS modulator 74, and a switched capacitor MLS circuit 103.

The envelope tracking system 110 of FIG. 3E is similar to the envelope tracking system 80 of FIG. 3B, except that the envelope tracking system 110 of FIG. 3E illustrates an implementation in which the multi-level switching circuit 102 includes the switched capacitor MLS circuit 103. As shown in FIG. 3E, the switched capacitor MLS circuit 103 generates multiple regulated voltages (corresponding to $V_{MLS1}$, $V_{MLS2}$, and $V_{MLS3}$, in this example) for the MLS modulator 72, which is controlled by the control circuit 74 to generate the output current $I_{MLS\_OUT}$.

Using the switched capacitor MLS circuit 103 to generate the regulated voltages for the MLS modulator 72 can provide a relatively compact area relative to an inductor-based MLS DC-to-DC converter, such as a buck-boost converter. Furthermore, the switched capacitor MLS circuit 103 can provide advantages for capacitor stacking to achieve higher voltage. For example, the switched capacitor MLS circuit 103 can include one or more charge pumps for generating boosted voltages. Although the switched capacitor MLS circuit 103 can provide certain advantages, the switched capacitor MLS circuit 103 can also have lower efficiency than an inductor-based MLS DC-to-DC converter.

In the illustrated embodiment, the ET combiner 54 and the power amplifier 51 are integrated on a power amplifier module including duplexer (PAMiD). Any of the embodiments herein can include one or more ET combiners integrated with one or more power amplifiers on a PAMiD.

Figure 4:
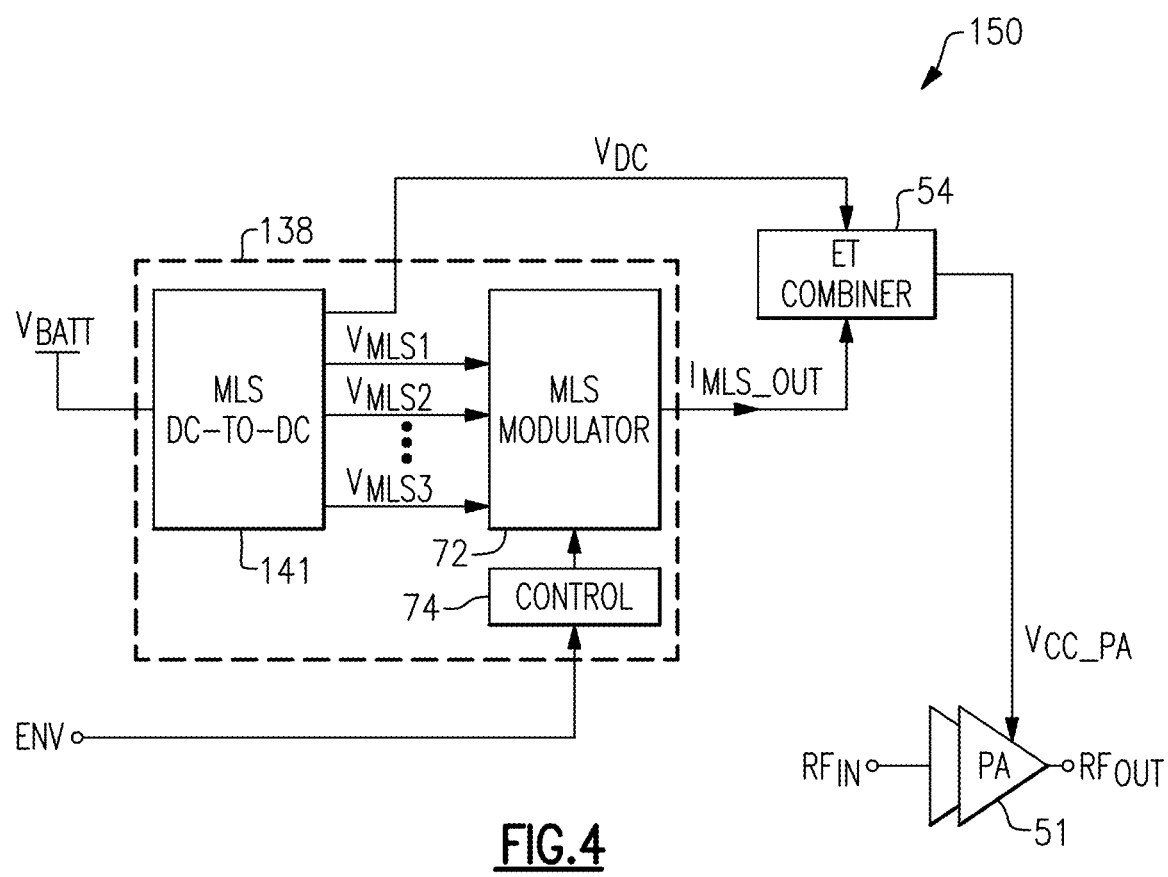
FIG. 4 is a schematic diagram of another embodiment of an envelope tracking system for a power amplifier.

FIG. 4 is a schematic diagram of another embodiment of an envelope tracking system 150 for a power amplifier 51. The envelope tracking system 150 includes an ET combiner 54 and a DC-to-DC converter 138.

The envelope tracking system 150 of FIG. 4 is similar to the envelope tracking system 80 of FIG. 3B, except that the envelope tracking system 150 omits the DC-to-DC converter 52 of FIG. 3B in favor of using the multi-level switching circuit 138 to generate the regulated DC voltage $V_{DC}$.

For example, the multi-level switching circuit 138 includes an MLS DC-to-DC converter 141, an MLS modulator 72, and a control circuit 74. Additionally, the MLS DC-to-DC converter 141 not only generates multiple regulated voltages (corresponding to $V_{MLS1}$, $V_{MLS2}$, and $V_{MLS3}$, in this example) for the MLS modulator 72, but also the regulated DC voltage $V_{DC}$ for the ET combiner 54. Although an example is depicted in which the regulated DC voltage $V_{DC}$ is a different voltage from the regulated voltages provided to the MLS modulator 72, in another embodiment the regulated DC voltage $V_{DC}$ corresponds to one of the regulated voltages provided to the MLS modulator 72.

Figure 5A:
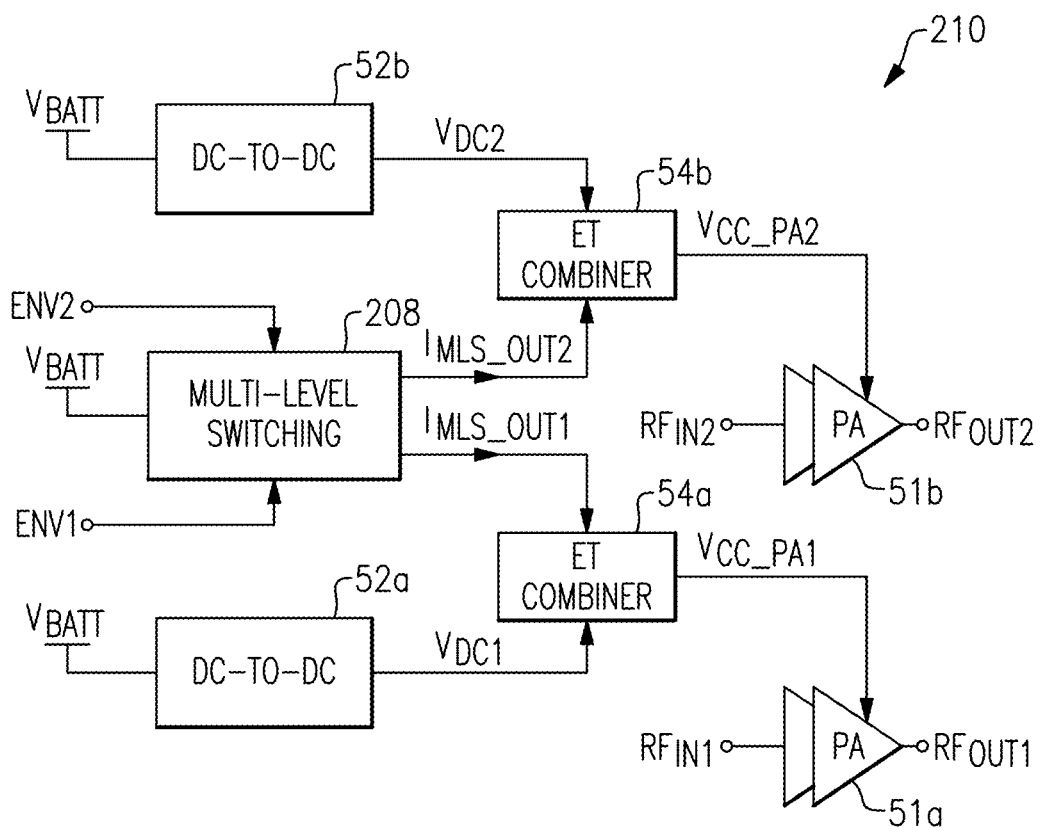
FIG. 5A is a schematic diagram of one embodiment of an envelope tracking system for multiple power amplifiers.

FIG. 5A is a schematic diagram of one embodiment of an envelope tracking system 210 for a first power amplifier 51a and a second power amplifier 51b. The envelope tracking system 210 includes a first DC-to-DC converter 52a, a second DC-to-DC converter 52b, a first ET combiner 54a, a second ET combiner 54b, and a multi-level switching circuit 208.

As shown in FIG. 5A, the first power amplifier 51a amplifies a first RF input signal $RF_{IN1}$ to generate a first RF output signal $RF_{OUT1}$. Additionally, the second power amplifier 51b amplifies a second RF input signal $RF_{IN2}$ to generate a second RF output signal $RF_{OUT2}$. Although depicted as including two stages, the first power amplifier 51a and/or the second power amplifier 51b can include more or fewer stages.

Furthermore, although an example is depicted in which the envelope tracking system 210 generates power amplifier supply voltages for two power amplifiers, the envelope tracking system 210 can be adapted to generate power amplifier supply voltages for three or more power amplifiers.

In the illustrated embodiment, the multi-level switching circuit 208 is powered by a battery voltage $V_{BATT}$. Additionally, the multi-level switching circuit 208 receives a first envelope signal ENV1, which changes in relation to an envelope of the first RF input signal $RF_{IN1}$. The multi-level switching circuit 208 processes the first envelope signal ENV1 to generate a first output current $I_{MLS\_OUT1}$. Furthermore, the multi-level switching circuit 208 receives a second envelope signal ENV2, which changes in relation to an envelope of the second RF input signal $RF_{IN2}$. The multi-level switching circuit 208 processes the second envelope signal ENV2 to generate a second output current $I_{MLS\_OUT2}$.

As shown in FIG. 5A, the first DC-to-DC converter 52a receives the battery voltage $V_{BATT}$ and operates to generate a first regulated DC voltage $V_{DC1}$. Additionally, the second DC-to-DC converter 52b receives the battery voltage $V_{BATT}$ and operates to generate a second regulated DC voltage $V_{DC2}$.

With continuing reference to FIG. 5A, the first ET combiner 54a operates to combine the first regulated DC voltage $V_{DC1}$ and the first output current $I_{MLS\_OUT1}$ to generate a first power amplifier supply voltage $V_{CC\_PA1}$ for the first power amplifier 51a. Additionally, the second ET combiner 54b operates to combine the second regulated DC voltage $V_{DC2}$ and the second output current $I_{MLS\_OUT2}$ to generate a second power amplifier supply voltage $V_{CC\_PA2}$ for the second power amplifier 51b.

In the illustrated embodiment, the multi-level switching circuit 208 is shared to generate the first power amplifier supply voltage $V_{CC\_PA1}$ for the first power amplifier 51a and the second power amplifier supply voltage $V_{CC\_PA2}$ for the second power amplifier 51b. Sharing the multi-level switching circuit 208 can provide a number of advantages, such as reduced component count and/or lower cost.

In certain implementations, the first power amplifier 51a and the second power amplifier 51b are used to amplify different carrier frequencies, for instance, for uplink carrier aggregation scenarios and/or EN-DC use cases in UE for 5G NR.

Figure 5B:
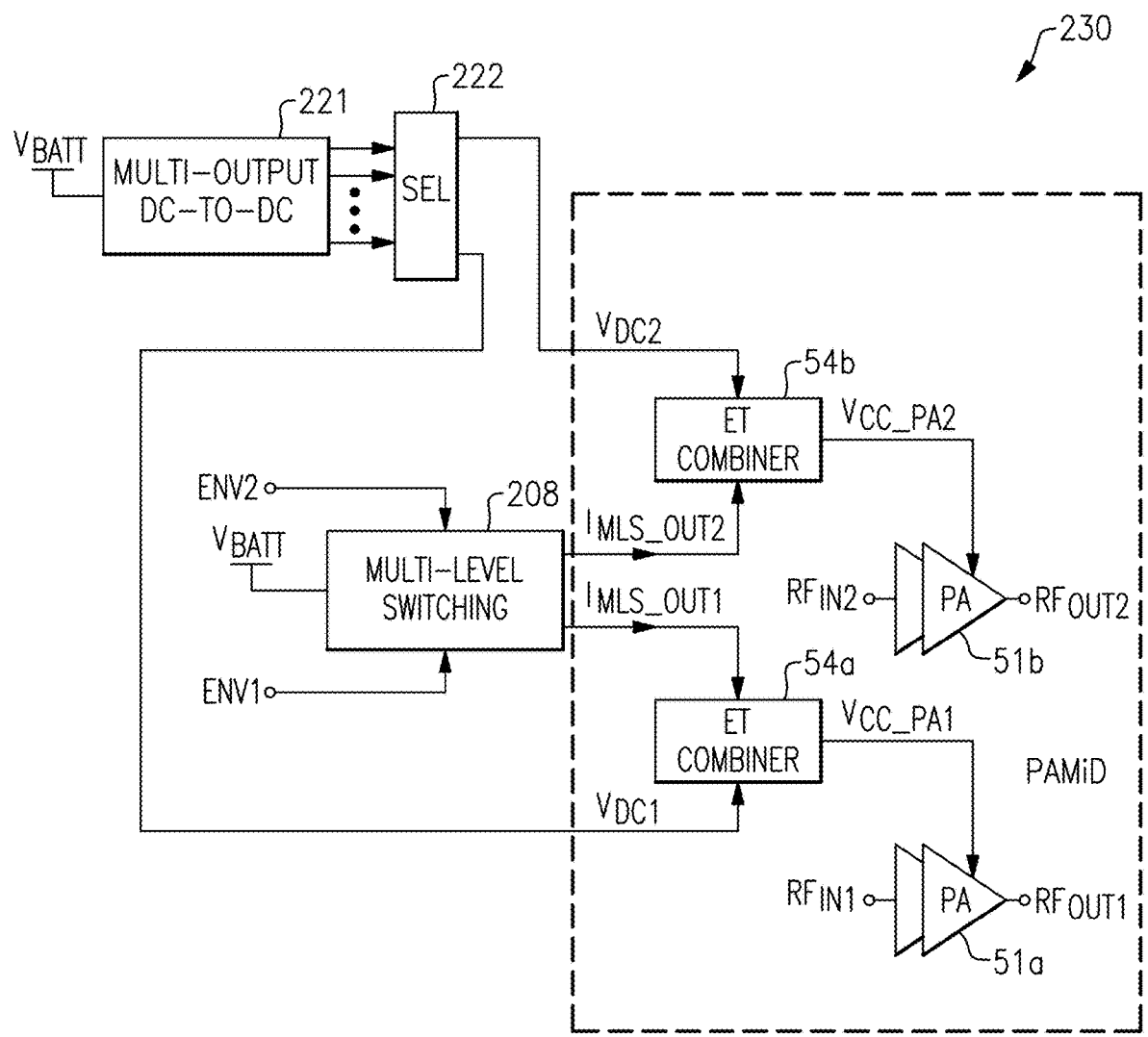
FIG. 5B is a schematic diagram of another embodiment of an envelope tracking system for multiple power amplifiers.

FIG. 5B is a schematic diagram of another embodiment of an envelope tracking system 230 for a first power amplifier 51a and a second power amplifier 51b. The envelope tracking system 230 includes a first ET combiner 54a, a second ET combiner 54b, a multi-level switching circuit 208, a multi-output DC-to-DC converter 221, and a DC voltage selection circuit 222.

The envelope tracking system 230 of FIG. 5B is similar to the envelope tracking system 210 of FIG. 5A, except that the envelope tracking system 230 of FIG. 5B omits the first DC-to-DC converter 52a and the second DC-to-DC converter 52b of FIG. 5A in favor of including the multi-output DC-to-DC converter 221 for generating the first regulated DC voltage $V_{DC1}$ and the second regulated DC voltage $V_{DC2}$. Thus, a common or shared DC-to-DC converter can be used to generate the DC voltages for two or more ET combiners.

To further enhance flexibility, the envelope tracking system 230 further includes the DC voltage selection circuit 222 for providing controllability as to which the output voltage of the multi-output DC-to-DC converter 221 serves as the first regulated DC voltage $V_{DC1}$ and which output voltage of the multi-output DC-to-DC converter 221 serves as the second regulated DC voltage $V_{DC2}$. For example, the multi-output DC-to-DC converter 221 generates two or more output voltages, each of which are selectable by the DC voltage selection circuit 222 (for instance, by digital data received over a bus) as the first regulated DC voltage $V_{DC1}$ and/or the second regulated DC voltage $V_{DC2}$.

In the illustrated embodiment, the first ET combiner 54a, the second ET combiner 54b, the first power amplifier 51a, and the second power amplifier 51b are integrated on a PAMiD. Any of the embodiments herein can include one or more ET combiners integrated with one or more power amplifiers on a PAMiD.

Figure 6:
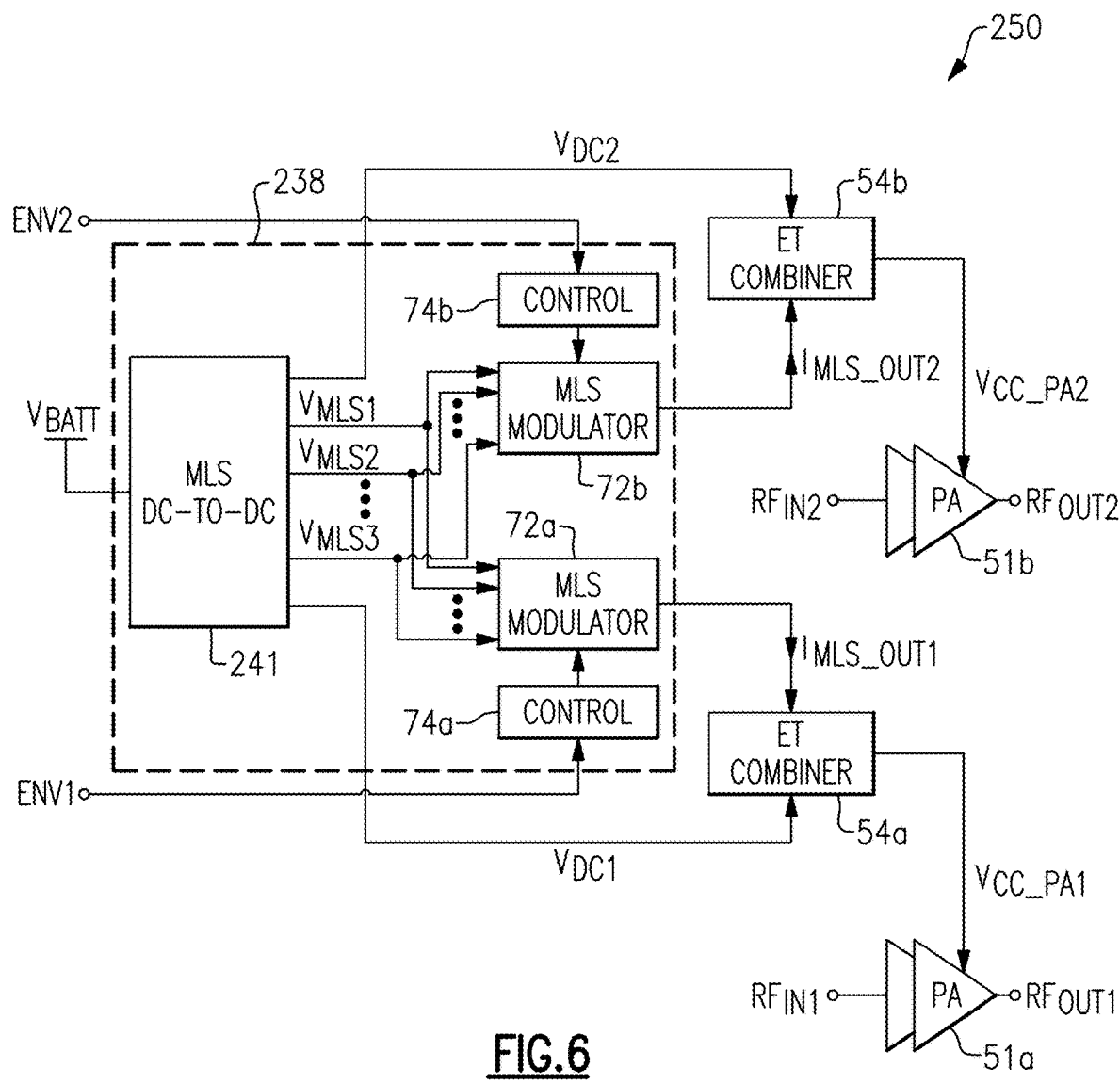
FIG. 6 is a schematic diagram of another embodiment of an envelope tracking system for multiple power amplifiers.

FIG. 6 is a schematic diagram of another embodiment of an envelope tracking system 250 for a first power amplifier 51a and a second power amplifier 51b. The envelope tracking system 250 includes a first ET combiner 54a, a second ET combiner 54b, and a multi-level switching circuit 238.

The envelope tracking system 250 of FIG. 6 is similar to the envelope tracking system 210 of FIG. 5A, except that the envelope tracking system 250 omits the first DC-to-DC converter 52a and the second DC-to-DC converter 52b of FIG. 5A in favor of using the multi-level switching circuit 238 to generate the first regulated DC voltage $V_{DC1}$ and the second regulated DC voltage $V_{DC2}$.

For example, the multi-level switching circuit 238 includes an MLS DC-to-DC converter 241, a first MLS modulator 72a, a second MLS modulator 72b, a first control circuit 74a, and a second control circuit 74b. Additionally, the MLS DC-to-DC converter 241 not only generates multiple regulated voltages (corresponding to $V_{MLS1}$, $V_{MLS2}$, and $V_{MLS3}$, in this example) for the first MLS modulator 72a and the second MLS modulator 72b, but also the first regulated DC voltage $V_{DC1}$ for the first ET combiner 54a and the second regulated DC voltage $V_{DC2}$ for the second ET combiner 54b.

Although an example is depicted in which the first regulated DC voltage $V_{DC1}$ and the second regulated DC voltage $V_{DC2}$ are different voltages from the regulated voltages provided to the MLS modulators, in another embodiment the first regulated DC voltage $V_{DC1}$ and/or the second regulated DC voltage $V_{DC2}$ Correspond to one of the regulated voltages provided to the MLS modulators.

Figure 7:
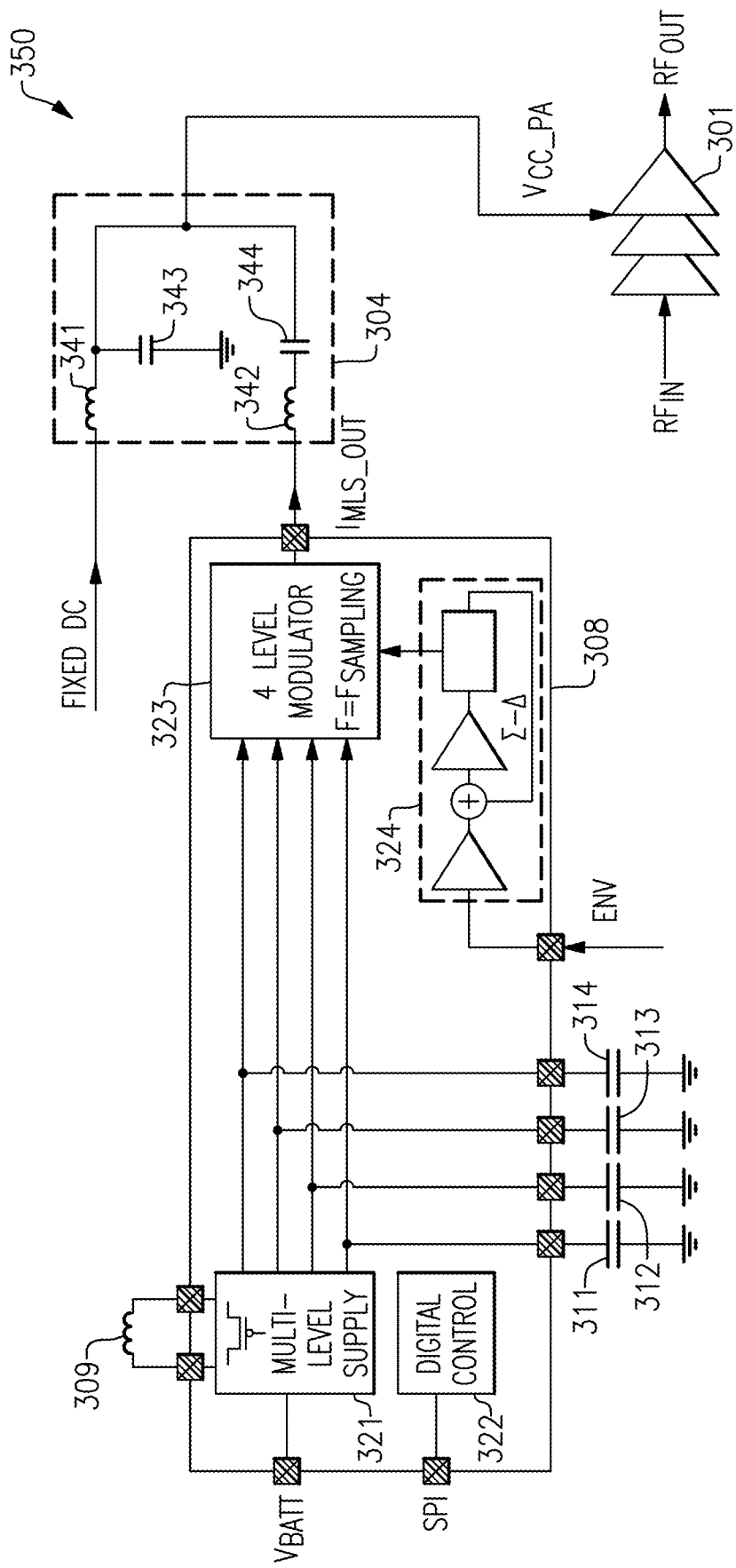
FIG. 7 is a schematic diagram of another embodiment of an envelope tracking system for a power amplifier.

FIG. 7 is a schematic diagram of another embodiment of an envelope tracking system 350 for a power amplifier 301. The envelope tracking system 350 includes an ET combiner 304, an MLS switcher integrated circuit (IC) 308, an inductor 309, a first decoupling capacitor 311, a second decoupling capacitor 312, a third decoupling capacitor 313, and a fourth decoupling capacitor 314.

In certain implementations, the envelope tracking system 350 is implemented in a packaged module, with the MLS switcher IC 308 implemented as a first semiconductor die on a substrate of the module, with the power amplifier 301 implemented as a second semiconductor die on the substrate, and with the ET combiner 304, the inductor 309 and the decoupling capacitors 311-314 implemented using surface mount components on the substrate.

In the illustrated embodiment, the ET combiner 304 includes a first inductor 341, a second inductor 342, a shunt capacitor 343, and a series capacitor 344. The ET combiner 304 combines an output current $I_{MLS\_OUT}$ of the MLS switcher IC 308 and a fixed DC voltage to generate a power amplifier supply voltage $V_{CC\_PA}$ for the power amplifier 301.

As shown in FIG. 7, the power amplifier 301 amplifies an RF input signal $RF_{IN}$ to generate an RF output signal $RF_{OUT}$. Although shown as including three stages, the power amplifier 301 can include more or fewer stages.

In the illustrated embodiment, the MLS switcher IC 308 includes MLS converter circuitry 321, a digital control circuit 322, an MLS modulator 323 (four-level, in this example), and a Σ-Δ encoder 324.

As shown in FIG. 7, the MLS converter circuitry 321 is coupled to a battery pin for receiving a battery voltage $V_{BATT}$, and to a pair of inductor pins for connected to the inductor 309. Additionally, the MLS converter circuitry 321 controls the current through the inductor 309 to generate multiple regulated voltages (four, in this example) for the MLS modulator 323. In this example, each of the regulated voltages generated by the MLS converter circuitry 321 is connected to one of the decoupling capacitors 311-314 through a corresponding capacitor pin.

With continuing reference to FIG. 7, the Σ-Δ encoder 324 processes an envelope signal ENV from an envelope pin to generate control signals for the MLS modulator 323. The MLS modulator 323 processes the control signals and the regulated voltages to provide the output current $I_{MLS\_OUT}$ to the ET combiner 304 by way of an output current pin.

In the illustrated embodiment, the MLS switcher IC 308 also includes the digital control circuit 322, which is coupled to pins of a serial interface (a serial peripheral interface or SPI bus, in this example). The digital control circuit 322 can provide a wide variety of control functions to the MLS switcher IC 308 based on data received over the interface. In one example, the regulated output voltage levels of the MLS converter circuitry 321 are programmable by data received over the interface.

Figure 8:
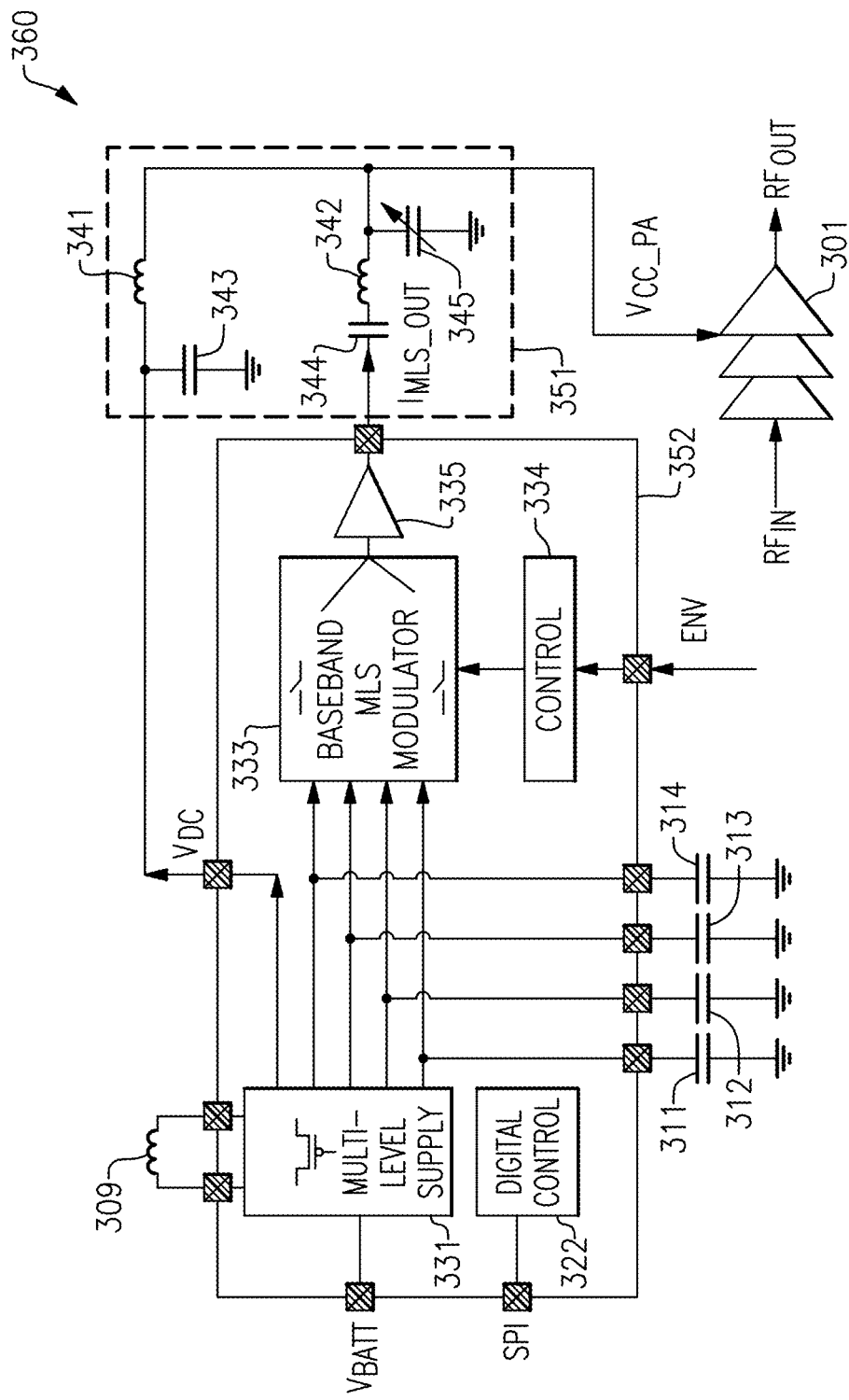
FIG. 8 is a schematic diagram of another embodiment of an envelope tracking system for a power amplifier.

FIG. 8 is a schematic diagram of another embodiment of an envelope tracking system 360 for a power amplifier 301. The envelope tracking system 360 includes an ET combiner 351, an MLS switcher IC 352, an inductor 309, a first decoupling capacitor 311, a second decoupling capacitor 312, a third decoupling capacitor 313, and a fourth decoupling capacitor 314.

In the illustrated embodiment, the ET combiner 351 includes a first inductor 341, a second inductor 342, a shunt capacitor 343, a series capacitor 344, and a controllable bandwidth adjustment capacitor 345. The ET combiner 351 combines an output current $I_{MLS\_OUT}$ of the MLS switcher IC 352 and a regulated DC voltage $V_{DC}$ from the MLS switcher IC 352 to generate a power amplifier supply voltage $V_{CC\_PA}$ for the power amplifier 301.

In the illustrated embodiment, the MLS switcher IC 308 includes a digital control circuit 322, MLS converter circuitry 331, a baseband MLS modulator 333 (four-level, in this example), a modulator control circuit 334, and an amplifier 335. As shown in FIG. 8, the amplifier 335 outputs the output current $I_{MLS\_OUT}$ of the MLS switcher IC 352, and is interposed between the baseband MLS modulator 333 and the ET combiner 351. Additionally, the MLS converter circuitry 331 not only generates regulated voltages (four, in this example) for the baseband MLS modulator 333, but also the regulated DC voltage $V_{DC}$ provided to the ET combiner 351.

Figure 9:
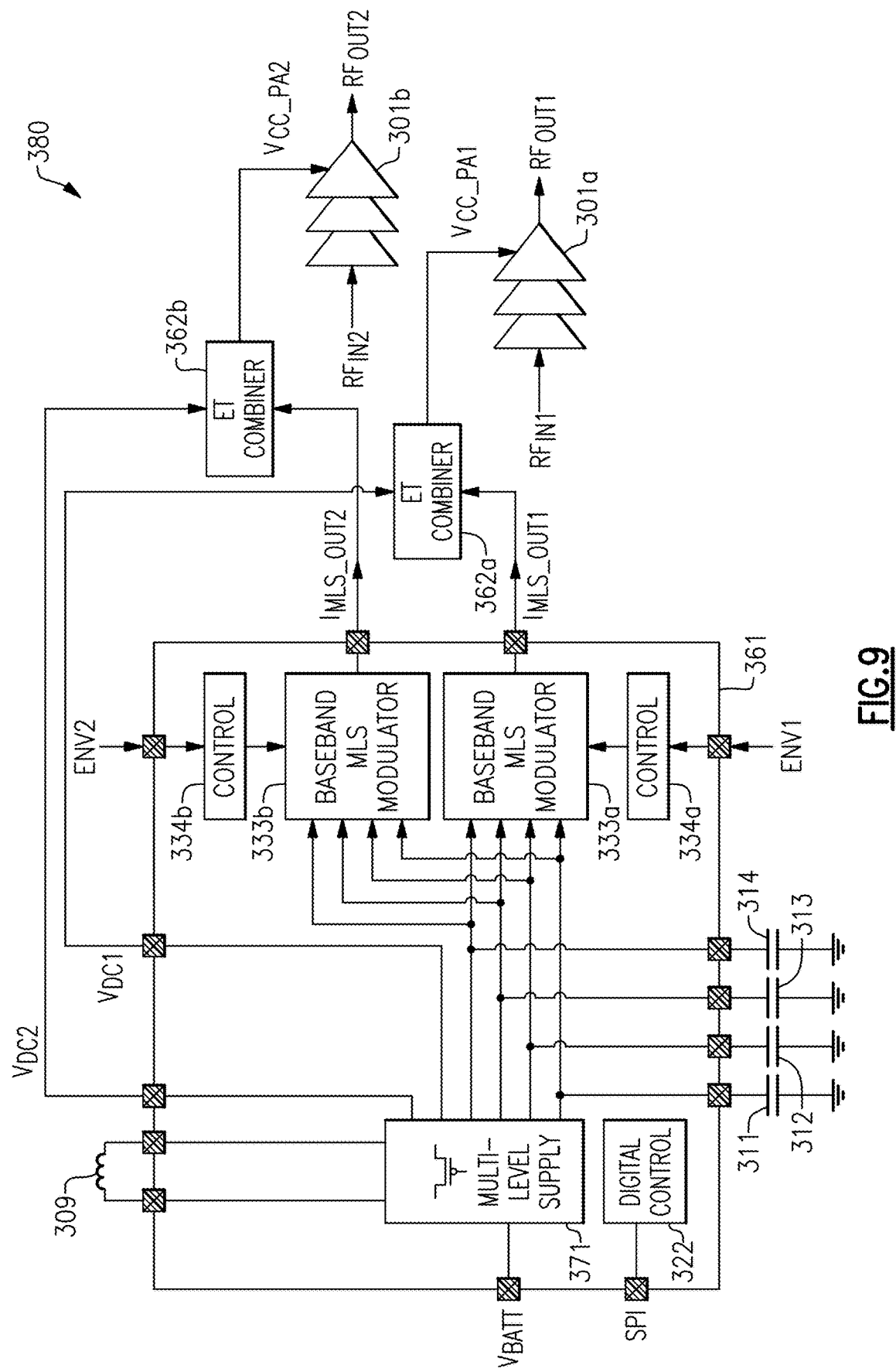
FIG. 9 is a schematic diagram of another embodiment of an envelope tracking system for multiple power amplifiers.

FIG. 9 is a schematic diagram of another embodiment of an envelope tracking system 380 for a first power amplifier 301a and a second power amplifier 301b. The envelope tracking system 380 includes an MLS switcher IC 361, a first ET combiner 362a, a second ET combiner 362b, an inductor 309, a first decoupling capacitor 311, a second decoupling capacitor 312, a third decoupling capacitor 313, and a fourth decoupling capacitor 314.

As shown in FIG. 9, the first ET combiner 362a combines a first output current $I_{MLS\_OUT1}$ of the MLS switcher IC 361 and a first regulated DC voltage $V_{DC1}$ from the MLS switcher IC 361 to generate a first power amplifier supply voltage $V_{CC\_PA1}$ for the first power amplifier 301a. Additionally, the second ET combiner 362b combines a second output current $I_{MLS\_OUT2}$ of the MLS switcher IC 361 and a second regulated DC voltage $V_{DC2}$ from the MLS switcher IC 361 to generate a second power amplifier supply voltage $V_{CC\_PA2}$ for the second power amplifier 301b. The first power amplifier 301a amplifies a first RF input signal $RF_{IN1}$ to generate a first RF output signal $RF_{OUT1}$, while the second power amplifier 301b amplifies a second RF input signal $RF_{IN2}$ to generate a second RF output signal $RF_{OUT2}$.

In the illustrated embodiment, the MLS switcher IC 361 includes a digital control circuit 322, a first baseband MLS modulator 333a (four-level, in this example), a second baseband MLS modulator 333b (four-level, in this example), a first modulator control circuit 334a, a second modulator control circuit 334b, and MLS converter circuitry 371.

As shown in FIG. 9, the MLS converter circuitry 371 is coupled to a battery pin for receiving a battery voltage $V_{BATT}$, and to a pair of inductor pins for connected to the inductor 309. Additionally, the MLS converter circuitry 371 controls the current through the inductor 309 to generate multiple regulated voltages for the baseband MLS modulators 333a, 333b as well as the first regulated DC voltage $V_{DC1}$ for the first ET combiner 362a and the second regulated DC voltage $V_{DC2}$ for the second ET combiner 362b.

With continuing reference to FIG. 9, the first modulator control circuit 334a processes a first envelope signal ENV1 to generate control signals for the first baseband MLS modulator 333a, while the second modulator control circuit 334b processes a second envelope signal ENV2 to generate control signals for the second baseband MLS modulator 333b. The first envelope signal ENV1 indicates an envelope of the first RF input signal $RF_{IN1}$, while the second envelope signal ENV2 indicates an envelope of the second RF input signal $RF_{IN2}$.

Figure 10:
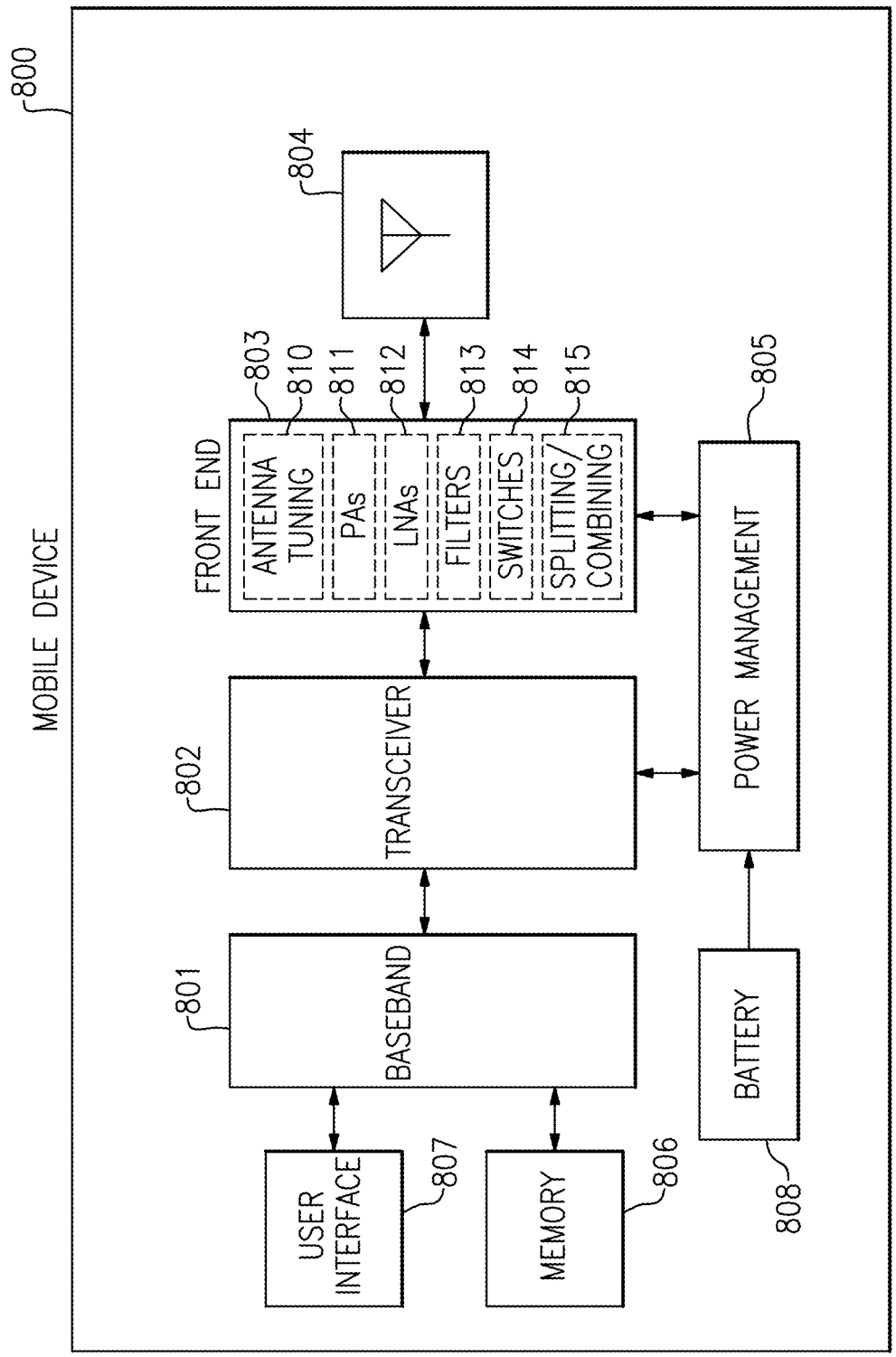
FIG. 10 is a schematic diagram of one embodiment of a mobile device.

FIG. 10 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 10 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 10, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 10, the power management system 805 receives a battery voltage from the battery 808. The battery 808 can be any suitable battery for use in the mobile device 800, including, for example, a lithium-ion battery.

Figure 11:
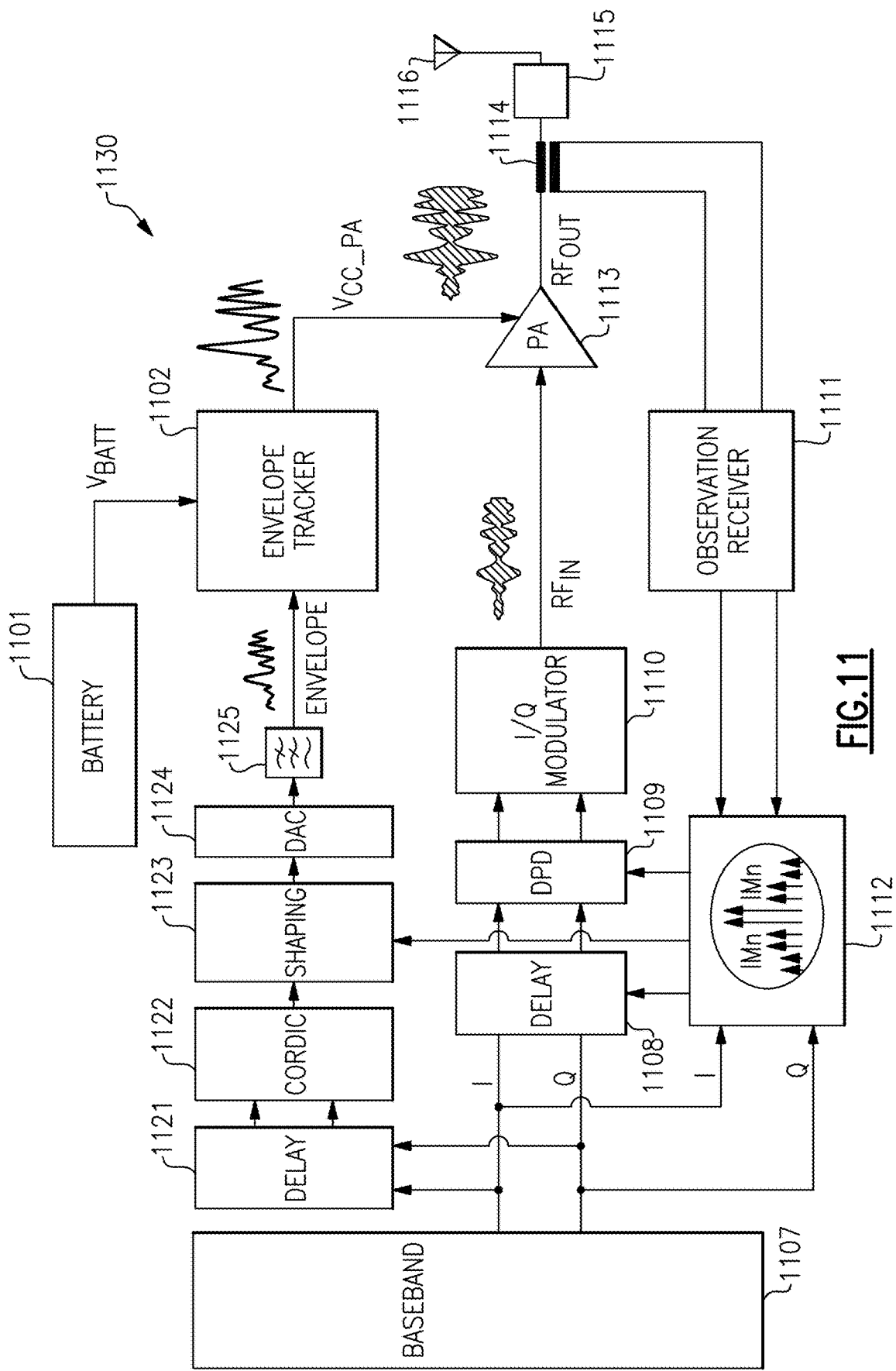
FIG. 11 is a schematic diagram of one embodiment of a communication system for transmitting RF signals.

FIG. 11 is a schematic diagram of one embodiment of a communication system 1130 for transmitting RF signals. The communication system 1130 includes a battery 1101, an envelope tracker 1102, a baseband processor 1107, a signal delay circuit 1108, a digital pre-distortion (DPD) circuit 1109, an I/Q modulator 1110, an observation receiver 1111, an intermodulation detection circuit 1112, a power amplifier 1113, a directional coupler 1114, a duplexing and switching circuit 1115, an antenna 1116, an envelope delay circuit 1121, a coordinate rotation digital computation (CORDIC) circuit 1122, a shaping circuit 1123, a digital-to-analog converter 1124, and a reconstruction filter 1125.

The communication system 1130 of FIG. 11 illustrates one example of an RF system operating with a power amplifier supply voltage controlled using envelope tracking. However, envelope tracking systems can be implemented in a wide variety of ways.

The baseband processor 1107 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 1110 in a digital format. The baseband processor 1107 can be any suitable processor configured to process a baseband signal. For instance, the baseband processor 1107 can include a digital signal processor, a microprocessor, a programmable core, or any combination thereof.

The signal delay circuit 1108 provides adjustable delay to the I and Q signals to aid in controlling relative alignment between the envelope signal and the RF signal $RF_{IN}$. The amount of delay provided by the signal delay circuit 1108 is controlled based on amount of intermodulation detected by the intermodulation detection circuit 1112.

The DPD circuit 1109 operates to provide digital shaping to the delayed I and Q signals from the signal delay circuit 1108 to generate digitally pre-distorted I and Q signals. In the illustrated embodiment, the pre-distortion provided by the DPD circuit 1109 is controlled based on amount of intermodulation detected by the intermodulation detection circuit 1112. The DPD circuit 1109 serves to reduce a distortion of the power amplifier 1113 and/or to increase the efficiency of the power amplifier 1113.

The I/Q modulator 1110 receives the digitally pre-distorted I and Q signals, which are processed to generate an RF signal $RF_{IN}$. For example, the I/Q modulator 1110 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 1113. In certain implementations, the I/Q modulator 1110 can include one or more filters configured to filter frequency content of signals processed therein.

The envelope delay circuit 1121 delays the I and Q signals from the baseband processor 1107. Additionally, the CORDIC circuit 1122 processes the delayed I and Q signals to generate a digital envelope signal representing an envelope of the RF signal $RF_{IN}$. Although FIG. 11 illustrates an implementation using the CORDIC circuit 1122, an envelope signal can be obtained in other ways.

The shaping circuit 1123 operates to shape the digital envelope signal to enhance the performance of the communication system 1130. In certain implementations, the shaping circuit 1123 includes a shaping table that maps each level of the digital envelope signal to a corresponding shaped envelope signal level. Envelope shaping can aid in controlling linearity, distortion, and/or efficiency of the power amplifier 1113.

In the illustrated embodiment, the shaped envelope signal is a digital signal that is converted by the DAC 1124 to an analog envelope signal. Additionally, the analog envelope signal is filtered by the reconstruction filter 1125 to generate an envelope signal suitable for use by the envelope tracker 1102. In certain implementations, the reconstruction filter 1125 includes a low pass filter.

With continuing reference to FIG. 11, the envelope tracker 1102 receives the envelope signal from the reconstruction filter 1125 and a battery voltage $V_{BATT}$ from the battery 1101, and uses the envelope signal to generate a power amplifier supply voltage $V_{CC\_PA}$ for the power amplifier 1113 that changes in relation to the envelope of the RF signal $RF_{IN}$. The power amplifier 1113 receives the RF signal $RF_{IN}$ from the I/Q modulator 1110, and provides an amplified RF signal $RF_{OUT}$ to the antenna 1116 through the duplexing and switching circuit 1115, in this example.

The directional coupler 1114 is positioned between the output of the power amplifier 1113 and the input of the duplexing and switching circuit 1115, thereby allowing a measurement of output power of the power amplifier 1113 that does not include insertion loss of the duplexing and switching circuit 1115. The sensed output signal from the directional coupler 1114 is provided to the observation receiver 1111, which can include mixers for down converting I and Q signal components of the sensed output signal, and DACs for generating I and Q observation signals from the downconverted signals.

The intermodulation detection circuit 1112 determines an intermodulation product between the I and Q observation signals and the I and Q signals from the baseband processor 1107. Additionally, the intermodulation detection circuit 1112 controls the pre-distortion provided by the DPD circuit 1109 and/or a delay of the signal delay circuit 1108 to control relative alignment between the envelope signal and the RF signal $RF_{IN}$. In certain implementations, the intermodulation detection circuit 1112 also serves to control shaping provided by the shaping circuit 1123.

By including a feedback path from the output of the power amplifier 1113 and baseband, the I and Q signals can be dynamically adjusted to optimize the operation of the communication system 1130. For example, configuring the communication system 1130 in this manner can aid in providing power control, compensating for transmitter impairments, and/or in performing DPD.

Although illustrated as a single stage, the power amplifier 1113 can include one or more stages. Furthermore, the teachings herein are applicable to communication systems including multiple power amplifiers. In such implementations, separate envelope trackers can be provided for different power amplifiers and/or one or more shared envelope trackers can be used.

Figure 12:
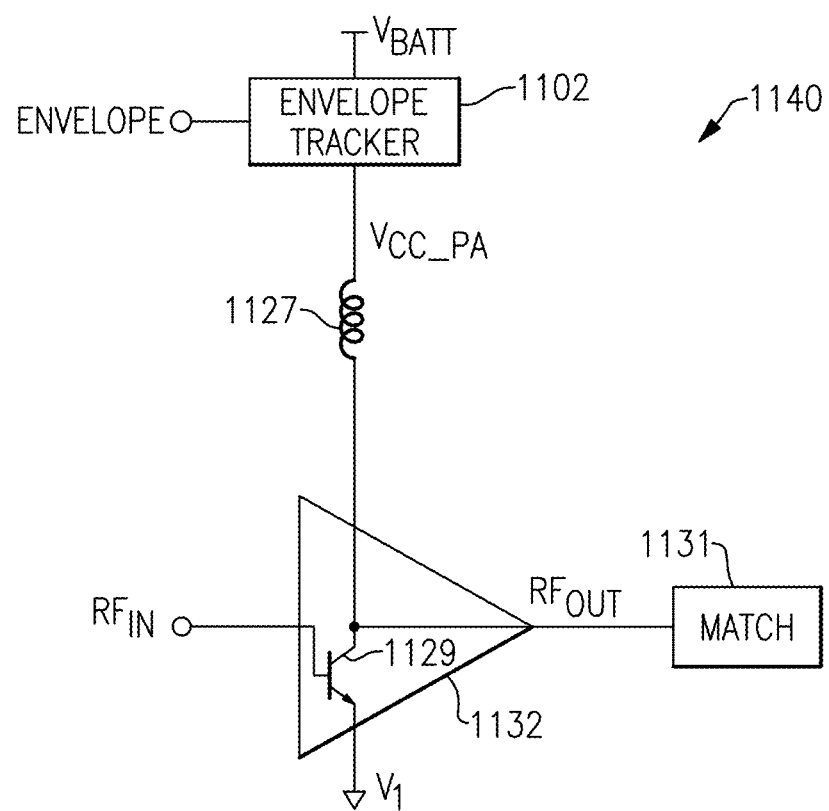
FIG. 12 is a schematic diagram of one example of a power amplifier system including an envelope tracker.

FIG. 12 is a schematic diagram of one example of a power amplifier system 1140 including an envelope tracker 1102. The illustrated power amplifier system 1140 further includes an inductor 1127, an output impedance matching circuit 1131, and a power amplifier 1132. The illustrated envelope tracker 1102 receives a battery voltage $V_{BATT}$ and an envelope of the RF signal and generates a power amplifier supply voltage $V_{CC\_PA}$ for the power amplifier 1132.

The illustrated power amplifier 1132 includes a bipolar transistor 1129 having an emitter, a base, and a collector. As shown in FIG. 12, the emitter of the bipolar transistor 1129 is electrically connected to a power low supply voltage $V_1$, which can be, for example, a ground supply. Additionally, an RF signal ($RF_{IN}$) is provided to the base of the bipolar transistor 1129, and the bipolar transistor 1129 amplifies the RF signal to generate an amplified RF signal at the collector. The bipolar transistor 1129 can be any suitable device. In one implementation, the bipolar transistor 1129 is a heterojunction bipolar transistor (HBT).

The output impedance matching circuit 1131 serves to terminate the output of the power amplifier 1132, which can aid in increasing power transfer and/or reducing reflections of the amplified RF signal generated by the power amplifier 1132. In certain implementations, the output impedance matching circuit 1131 further operates to provide harmonic termination and/or to control a load line impedance of the power amplifier 1132.

The inductor 1127 can be included to provide the power amplifier 1132 with the power amplifier supply voltage $V_{CC\_PA}$ generated by the envelope tracker 1102 while choking or blocking high frequency RF signal components. The inductor 1127 can include a first end electrically connected to the envelope tracker 1102, and a second end electrically connected to the collector of the bipolar transistor 1129. In certain implementations, the inductor 1127 operates in combination with the impedance matching circuit 1131 to provide output matching.

Although FIG. 12 illustrates one implementation of the power amplifier 1132, skilled artisans will appreciate that the teachings described herein can be applied to a variety of power amplifier structures, such as multi-stage power amplifiers and power amplifiers employing other transistor structures. For example, in some implementations the bipolar transistor 1129 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor. Additionally, the power amplifier 1132 can be adapted to include additional circuitry, such as biasing circuitry.

Figure 13A:
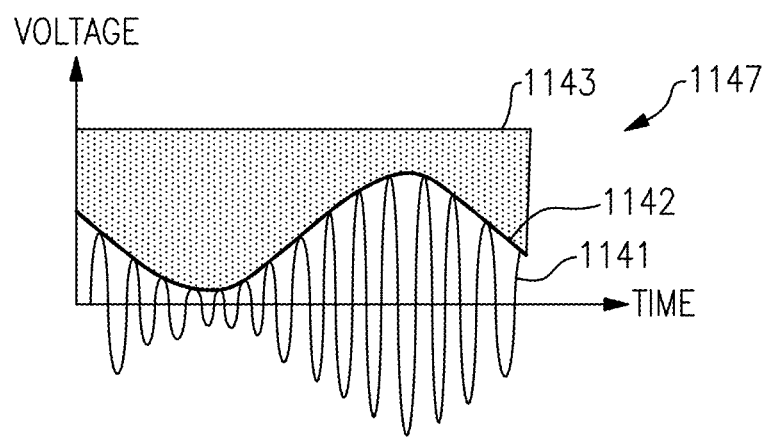
FIG. 13A shows a first example of a power amplifier supply voltage versus time.
Figure 13B:
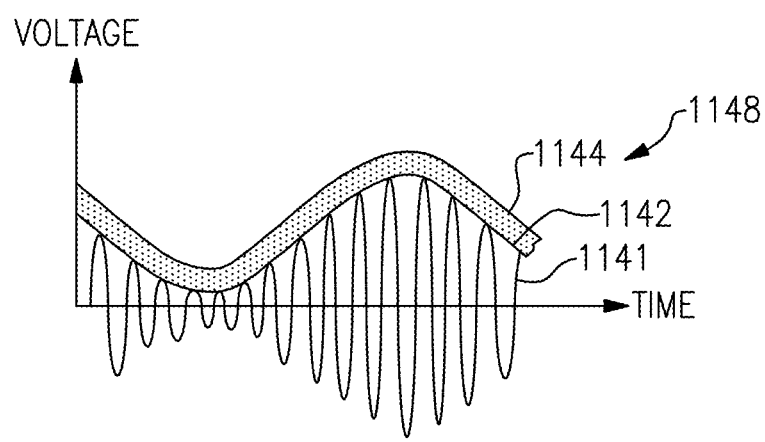
FIG. 13B shows a second example of a power amplifier supply voltage versus time.

FIGS. 13A and 13B show two examples of power amplifier supply voltage versus time.

In FIG. 13A, a graph 1147 illustrates one example of the voltage of an RF signal 1141 and a power amplifier supply voltage 1143 versus time. The RF signal 1141 has an envelope 1142.

It can be important that the power amplifier supply voltage 1143 of a power amplifier has a voltage greater than that of the RF signal 1141. For example, powering a power amplifier using a power amplifier supply voltage that has a magnitude less than that of the RF signal can clip the RF signal, thereby creating signal distortion and/or other problems. Thus, it can be important the power amplifier supply voltage 1143 be greater than that of the envelope 1142. However, it can be desirable to reduce a difference in voltage between the power amplifier supply voltage 1143 and the envelope 1142 of the RF signal 1141, as the area between the power amplifier supply voltage 1143 and the envelope 1142 can represent lost energy, which can reduce battery life and increase heat generated in a wireless device.

In FIG. 13B, a graph 1148 illustrates another example of the voltage of an RF signal 1141 and a power amplifier supply voltage 1144 versus time. In contrast to the power amplifier supply voltage 1143 of FIG. 13A, the power amplifier supply voltage 1144 of FIG. 13B changes in relation to the envelope 1142 of the RF signal 1141. The area between the power amplifier supply voltage 1144 and the envelope 1142 in FIG. 13B is less than the area between the power amplifier supply voltage 1143 and the envelope 1142 in FIG. 13A, and thus the graph 1148 of FIG. 13B can be associated with a power amplifier system having greater energy efficiency.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, may, "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a radio frequency transmit signal;
a front end circuit including a power amplifier configured to amplify the radio frequency transmit signal; and
a power management circuit including an envelope tracker configured to generate a power amplifier supply voltage of the power amplifier, the envelope tracker including a multi-level switching circuit configured to generate an output current based on an envelope signal indicating an envelope of the radio frequency transmit signal, and a combiner configured to combine a DC voltage with the output current to generate a power amplifier supply voltage of the power amplifier, the multi-level switching circuit including a multi-level supply DC-to-DC converter configured to generate a plurality of regulated voltages of different voltage levels, a modulator configured to receive the plurality of regulated voltages and to generate the output current, a control circuit configured to control the modulator based on the envelope signal, and an amplifier interposed between the modulator and the combiner.

2. The mobile device of claim 1 wherein the multi-level supply DC-to-DC converter is further configured to generate the DC voltage.

3. The mobile device of claim 1 wherein the multi-level switching circuit has an output providing the output current, the modulator further including a plurality of switches each electrically connected between a corresponding one of the plurality of regulated voltages and the output.

4. A mobile device comprising:
a transceiver configured to generate a radio frequency transmit signal;
a front end circuit including a power amplifier configured to amplify the radio frequency transmit signal; and
a power management circuit including an envelope tracker configured to generate a power amplifier supply voltage of the power amplifier, the envelope tracker including a multi-level switching circuit configured to generate an output current based on an envelope signal indicating an envelope of the radio frequency transmit signal, and a combiner configured to combine a DC voltage with the output current to generate a power amplifier supply voltage of the power amplifier, the multi-level switching circuit including a multi-level supply DC-to-DC converter configured to generate a plurality of regulated voltages of different voltage levels, a modulator configured to receive the plurality of regulated voltages and to generate the output current, and a control circuit configured to control the modulator based on the envelope signal, the control circuit including a sigma-delta encoder.

5. A mobile device comprising:
a transceiver configured to generate a radio frequency transmit signal;
a front end circuit including a power amplifier configured to amplify the radio frequency transmit signal; and
a power management circuit including an envelope tracker configured to generate a power amplifier supply voltage of the power amplifier, the envelope tracker including a multi-level switching circuit configured to generate an output current based on an envelope signal indicating an envelope of the radio frequency transmit signal, and a combiner configured to combine a DC voltage with the output current to generate a power amplifier supply voltage of the power amplifier, the multi-level switching circuit having an output providing the output current, the combiner including a first inductor electrically connected between the DC voltage and the power amplifier supply voltage, and a series capacitor connected between the output and the power amplifier supply voltage.

6. The mobile device of claim 5 wherein the multi-level switching circuit includes a switched capacitor multi-level supply circuit configured to generate a plurality of regulated voltages of different voltage levels, a modulator configured to receive the plurality of regulated voltages and to generate the output current, and a control circuit configured to control the modulator based on the envelope signal.

7. The mobile device of claim 5 wherein the combiner further includes a second inductor electrically connected in series with the series capacitor between the output and the power amplifier supply voltage.

8. The mobile device of claim 5 wherein the combiner further includes a controllable bandwidth adjustment capacitor electrically connected between the power amplifier supply voltage and ground.

9. The mobile device of claim 1 further comprising a battery operable to provide a battery voltage to the multi-level switching circuit.

10. A method of envelope tracking, the method comprising:
amplifying a radio frequency transmit signal using a power amplifier;
generating an output current based on an envelope signal using a multi-level switching circuit, the envelope signal indicating an envelope of the radio frequency transmit signal;
generating a power amplifier supply voltage of the power amplifier by combining a DC voltage and the output current using a combiner; and
adjusting a modulation bandwidth of envelope tracking using a controllable bandwidth adjustment capacitor of the combiner.

11. The method of claim 10 wherein generating the output current includes generating a plurality of regulated voltages of different voltage levels using a multi-level supply DC-to-DC converter, and modulating the plurality of regulated voltages based on the envelope signal to generate the output current using a modulator.

12. The method of claim 11 further comprising generating the DC voltage using the multi-level supply DC-to-DC converter.

13. The method of claim 11 further comprising controlling the modulator based on the envelope signal using a sigma-delta encoder.

14. The method of claim 10 further comprising generating the DC voltage using a DC-to-DC converter.

15. The mobile device of claim 4 wherein the multi-level supply DC-to-DC converter is further configured to generate the DC voltage.

16. The mobile device of claim 4 wherein the multi-level switching circuit has an output providing the output current, the modulator further including a plurality of switches each electrically connected between a corresponding one of the plurality of regulated voltages and the output.

17. The mobile device of claim 4 further comprising a battery operable to provide a battery voltage to the multi-level switching circuit.

18. The mobile device of claim 5 wherein the multi-level supply DC-to-DC converter is further configured to generate the DC voltage.

19. The mobile device of claim 5 wherein the modulator further includes a plurality of switches each electrically connected between a corresponding one of the plurality of regulated voltages and the output.

20. The mobile device of claim 5 further comprising a battery operable to provide a battery voltage to the multi-level switching circuit.

* * * * *